(12) United States Patent
Campbell

(10) Patent No.: US 7,619,419 B2
(45) Date of Patent: Nov. 17, 2009

(54) WIDEBAND ACTIVE-PASSIVE DIFFERENTIAL SIGNAL PROBE

(75) Inventor: Richard Campbell, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 201 days.

(21) Appl. No.: 11/413,738

(22) Filed: Apr. 28, 2006

(65) Prior Publication Data

US 2006/0290357 A1 Dec. 28, 2006

Related U.S. Application Data

(60) Provisional application No. 60/690,109, filed on Jun. 13, 2005, provisional application No. 60/739,397, filed on Nov. 23, 2005.

(51) Int. Cl.
*G01R 27/00* (2006.01)

(52) U.S. Cl. .................. 324/600; 324/437; 324/445; 324/446; 324/690; 324/754; 318/678; 327/52

(58) Field of Classification Search ............... 375/247, 375/258; 361/782; 330/69, 252; 381/100
See application file for complete search history.

(56) References Cited

U.S. PATENT DOCUMENTS

| | | | |
|---|---|---|---|
| 491,783 A | 2/1893 | Moyer |
| 1,337,866 A | 4/1920 | Whitacker |
| 2,142,625 A | 1/1939 | Zoethout |
| 2,376,101 A | 5/1945 | Tyzzer |
| 2,389,668 A | 11/1945 | Johnson |
| 2,545,258 A | 3/1951 | Cailloux |
| 2,762,234 A | 9/1956 | Dodd |
| 2,901,696 A | 8/1959 | Möllfors |
| 2,921,276 A | 1/1960 | Fubini |
| 2,947,939 A | 8/1960 | Harwig |
| 3,176,091 A | 3/1965 | Hanson et al. |
| 3,193,712 A | 7/1965 | Harris |
| 3,218,584 A | 11/1965 | Ayer |
| 3,230,299 A | 1/1966 | Radziekowski |
| 3,262,593 A | 7/1966 | Hainer |
| 3,396,598 A | 8/1968 | Grispo |
| 3,401,126 A | 9/1968 | Miller et al. |
| 3,429,040 A | 2/1969 | Miller |

(Continued)

FOREIGN PATENT DOCUMENTS

CH 607 045 11/1978

(Continued)

OTHER PUBLICATIONS

The Micromanipulator Company, data sheet, Double Sided Probing System, Jul. 2002, 2 pages.

(Continued)

*Primary Examiner*—Mohammad H Ghayour
*Assistant Examiner*—Adolf Dsouza
(74) *Attorney, Agent, or Firm*—Chernoff, Vihuaer, McClung & Stenzel

(57) ABSTRACT

A wideband differential signal probe includes separate paths to convert a lower frequency component and a higher frequency component of a differential signal to a lower frequency single ended signal and a higher frequency single ended signal which are combined for the probe's output which is commonly input to instrumentation.

5 Claims, 3 Drawing Sheets

U.S. PATENT DOCUMENTS

| | | |
|---|---|---|
| 3,445,770 A | 5/1969 | Harmon |
| 3,484,679 A | 12/1969 | Hodgson et al. |
| 3,541,222 A | 11/1970 | Parks et al. |
| 3,561,280 A | 2/1971 | MacPhee et al. |
| 3,573,617 A | 4/1971 | Randolph et al. |
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al |
| 3,700,998 A | 10/1972 | Lee at al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,803,709 A | 4/1974 | Beltz et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz et al. |
| 3,882,597 A | 5/1975 | Chayka et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Frosch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,476,363 A | 10/1984 | Berggren et al. |
| 4,480,223 A | 10/1984 | Aigo |
| 4,487,996 A | 12/1984 | Rabinowitz et al. |
| 4,491,783 A | 1/1985 | Sawayama et al. |
| 4,502,028 A | 2/1985 | Leake |
| 4,515,133 A | 5/1985 | Roman |
| 4,515,439 A | 5/1985 | Esswein |
| 4,520,314 A | 5/1985 | Asch et al. |
| 4,528,504 A | 7/1985 | Thornton, Jr. et al. |
| 4,531,474 A | 7/1985 | Inuta |
| 4,551,747 A | 11/1985 | Gilbert et al. |
| 4,552,033 A | 11/1985 | Marzhauser |
| 4,553,111 A | 11/1985 | Barrow |
| 4,558,609 A | 12/1985 | Kim |
| 4,563,640 A | 1/1986 | Hasegawa |
| 4,567,321 A | 1/1986 | Harayama |
| 4,567,436 A | 1/1986 | Koch |
| 4,568,890 A | 2/1986 | Bates |
| 4,581,679 A | 4/1986 | Smolley |
| 4,588,950 A | 5/1986 | Henley |
| 4,589,815 A | 5/1986 | Smith |
| 4,593,243 A | 6/1986 | Lao et al. |
| 4,600,907 A | 7/1986 | Grellman et al. |
| 4,621,169 A | 11/1986 | Petinelli et al. |
| 4,626,618 A | 12/1986 | Takaoka et al. |
| 4,626,805 A | 12/1986 | Jones |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,653,174 A | 3/1987 | Gilder, Jr. et al. |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |
| 4,696,544 A | 9/1987 | Costella |
| 4,697,143 A | 9/1987 | Lockwood et al. |
| 4,705,447 A | 11/1987 | Smith |
| 4,706,050 A | 11/1987 | Andrews |
| 4,707,657 A | 11/1987 | Bøegh-Petersen |
| 4,711,563 A | 12/1987 | Lass |
| 4,713,347 A | 12/1987 | Mitchell et al. |
| 4,714,873 A | 12/1987 | McPherson et al. |
| 4,725,793 A | 2/1988 | Igarashi |
| 4,727,319 A | 2/1988 | Shahriary |
| 4,727,391 A | 2/1988 | Tajima et al. |

| | | | | | | |
|---|---|---|---|---|---|---|
| 4,727,637 A | 3/1988 | Buckwitz et al. | | 5,001,423 A | 3/1991 | Abrami et al. |
| 4,734,641 A | 3/1988 | Byrd, Jr. et al. | | 5,003,253 A | 3/1991 | Majidi-Ahy et al. |
| 4,739,259 A | 4/1988 | Hadwin et al. | | 5,007,163 A | 4/1991 | Pope et al. |
| 4,740,764 A | 4/1988 | Gerlack | | 5,012,186 A | 4/1991 | Gleason |
| 4,742,571 A | 5/1988 | Letron | | 5,020,219 A | 6/1991 | Leedy |
| 4,744,041 A | 5/1988 | Strunk et al. | | 5,021,186 A | 6/1991 | Ota et al. |
| 4,746,857 A | 5/1988 | Sakai et al. | | 5,030,907 A | 7/1991 | Yih et al. |
| 4,749,942 A | 6/1988 | Sang et al. | | 5,041,782 A | 8/1991 | Marzan |
| 4,754,239 A | 6/1988 | Sedivec | | 5,045,781 A | 9/1991 | Gleason et al. |
| 4,755,746 A | 7/1988 | Mallory et al. | | 5,059,898 A | 10/1991 | Barsotti et al. |
| 4,755,747 A | 7/1988 | Sato | | 5,061,192 A | 10/1991 | Chapin et al. |
| 4,755,874 A | 7/1988 | Esrig et al. | | 5,061,823 A | 10/1991 | Carroll |
| 4,757,255 A | 7/1988 | Margozzi | | 5,066,357 A | 11/1991 | Smyth, Jr. et al. |
| 4,764,723 A | 8/1988 | Strid | | 5,069,628 A | 12/1991 | Crumly |
| 4,766,384 A | 8/1988 | Kleinberg et al. | | 5,082,627 A | 1/1992 | Stanbro |
| 4,772,846 A | 9/1988 | Reeds | | 5,084,671 A | 1/1992 | Miyata et al. |
| 4,780,670 A | 10/1988 | Cherry | | 5,089,774 A | 2/1992 | Nakano |
| 4,783,625 A | 11/1988 | Harry et al. | | 5,091,692 A | 2/1992 | Ohno et al. |
| 4,788,851 A | 12/1988 | Brault | | 5,091,732 A | 2/1992 | Mileski et al. |
| 4,791,363 A | 12/1988 | Logan | | 5,095,891 A | 3/1992 | Reitter |
| 4,793,814 A | 12/1988 | Zifcak et al. | | 5,097,101 A | 3/1992 | Trobough |
| 4,795,962 A | 1/1989 | Yanagawa et al. | | 5,097,207 A | 3/1992 | Blanz |
| 4,805,627 A | 2/1989 | Klingenbeck et al. | | 5,101,453 A | 3/1992 | Rumbaugh |
| 4,810,981 A | 3/1989 | Herstein | | 5,107,076 A | 4/1992 | Bullock et al. |
| 4,812,754 A | 3/1989 | Tracy et al. | | 5,116,180 A | 5/1992 | Fung et al. |
| 4,818,059 A | 4/1989 | Kakii et al. | | 5,126,286 A | 6/1992 | Chance |
| 4,827,211 A | 5/1989 | Strid et al. | | 5,126,696 A | 6/1992 | Grote et al. |
| 4,831,494 A | 5/1989 | Arnold et al. | | 5,128,612 A | 7/1992 | Aton et al. |
| 4,835,495 A | 5/1989 | Simonutti | | 5,129,006 A * | 7/1992 | Hill et al. ................ 381/100 |
| 4,837,507 A | 6/1989 | Hechtman | | 5,133,119 A | 7/1992 | Afshari et al. |
| 4,839,587 A | 6/1989 | Flatley et al. | | 5,134,365 A | 7/1992 | Okubo et al. |
| 4,849,689 A | 7/1989 | Gleason et al. | | 5,136,237 A | 8/1992 | Smith et al. |
| 4,851,767 A | 7/1989 | Halbout et al. | | 5,138,289 A | 8/1992 | McGrath |
| 4,853,624 A | 8/1989 | Rabjohn | | 5,142,224 A | 8/1992 | Smith et al. |
| 4,853,627 A | 8/1989 | Gleason et al. | | 5,145,552 A | 9/1992 | Yoshizawa et al. |
| 4,858,160 A | 8/1989 | Strid et al. | | 5,148,131 A | 9/1992 | Amboss et al. |
| 4,859,989 A | 8/1989 | McPherson | | 5,159,264 A | 10/1992 | Anderson |
| 4,864,227 A | 9/1989 | Sato | | 5,159,267 A | 10/1992 | Anderson |
| 4,871,883 A | 10/1989 | Guiol | | 5,159,752 A | 11/1992 | Mahant-Shetti et al. |
| 4,871,964 A | 10/1989 | Boll et al. | | 5,160,883 A | 11/1992 | Blanz |
| 4,888,550 A | 12/1989 | Reid | | 5,164,319 A | 11/1992 | Hafeman et al. |
| 4,891,584 A | 1/1990 | Kamieniecki et al. | | 5,166,606 A | 11/1992 | Blanz |
| 4,893,914 A | 1/1990 | Hancock et al. | | 5,170,930 A | 12/1992 | Dolbear et al. |
| 4,894,612 A | 1/1990 | Drake et al. | | 5,172,049 A | 12/1992 | Kiyokawa et al. |
| 4,899,126 A | 2/1990 | Yamada | | 5,172,050 A | 12/1992 | Swapp |
| 4,899,998 A | 2/1990 | Teramachi | | 5,172,051 A | 12/1992 | Zamborelli |
| 4,901,012 A | 2/1990 | Gloanec et al. | | 5,177,438 A | 1/1993 | Littlebury et al. |
| 4,904,933 A | 2/1990 | Snyder et al. | | 5,180,977 A | 1/1993 | Huff |
| 4,904,935 A | 2/1990 | Calma et al. | | 5,187,443 A | 2/1993 | Bereskin |
| 4,906,920 A | 3/1990 | Huff et al. | | 5,198,752 A | 3/1993 | Miyata et al. |
| 4,908,570 A | 3/1990 | Gupta et al. | | 5,198,753 A | 3/1993 | Hamburgen |
| 4,912,399 A | 3/1990 | Greub et al. | | 5,202,558 A | 4/1993 | Barker |
| 4,916,002 A | 4/1990 | Carver | | 5,202,648 A | 4/1993 | McCandless |
| 4,916,398 A | 4/1990 | Rath | | 5,207,585 A | 5/1993 | Byrnes et al. |
| 4,918,373 A | 4/1990 | Newberg | | 5,214,243 A | 5/1993 | Johnson |
| 4,918,383 A | 4/1990 | Huff et al. | | 5,214,374 A | 5/1993 | St. Onge |
| 4,922,128 A | 5/1990 | Dhong et al. | | 5,225,037 A | 7/1993 | Elder et al. |
| 4,922,186 A | 5/1990 | Tsuchiya et al. | | 5,227,730 A | 7/1993 | King et al. |
| 4,922,912 A | 5/1990 | Watanabe | | 5,232,789 A | 8/1993 | Platz et al. |
| 4,926,172 A | 5/1990 | Gorsek | | 5,233,197 A | 8/1993 | Bowman et al. |
| 4,929,893 A | 5/1990 | Sato et al. | | 5,233,306 A | 8/1993 | Misra |
| 4,965,514 A | 10/1990 | Herrick | | 5,245,292 A | 9/1993 | Milesky et al. |
| 4,970,386 A | 11/1990 | Buck | | 5,266,889 A | 11/1993 | Harwood et al. |
| 4,972,073 A | 11/1990 | Lessing | | 5,266,963 A | 11/1993 | Carter |
| 4,975,638 A | 12/1990 | Evans et al. | | 5,267,088 A | 11/1993 | Nomura |
| 4,980,637 A | 12/1990 | Huff et al. | | 5,270,664 A | 12/1993 | McMurtry et al. |
| 4,980,638 A | 12/1990 | Dermon et al. | | 5,274,336 A | 12/1993 | Crook et al. |
| 4,983,910 A | 1/1991 | Majidi-Ahy et al. | | 5,280,156 A | 1/1994 | Niori et al. |
| 4,987,100 A | 1/1991 | McBride et al. | | 5,281,364 A | 1/1994 | Stirling et al. |
| 4,988,062 A | 1/1991 | London | | 5,289,117 A | 2/1994 | Van Loan et al. |
| 4,991,290 A | 2/1991 | MacKay | | 5,293,175 A | 3/1994 | Hemmie et al. |
| 4,998,062 A | 3/1991 | Ikeda | | 5,298,972 A | 3/1994 | Heffner |
| 4,998,063 A | 3/1991 | Miller | | 5,304,924 A | 4/1994 | Yamano et al. |

| | | | | | | |
|---|---|---|---|---|---|---|
| 5,308,250 A | 5/1994 | Walz | | 5,550,481 A | 8/1996 | Holmes et al. |
| 5,313,157 A | 5/1994 | Pasiecznik, Jr. | | 5,561,378 A | 10/1996 | Bockelman et al. |
| 5,315,237 A | 5/1994 | Iwakura et al. | | 5,565,788 A | 10/1996 | Burr et al. |
| 5,316,435 A | 5/1994 | Monzingo | | 5,565,881 A | 10/1996 | Phillips et al. |
| 5,317,656 A | 5/1994 | Moslehi et al. | | 5,569,591 A | 10/1996 | Kell et al. |
| 5,321,352 A | 6/1994 | Takebuchi | | 5,571,324 A | 11/1996 | Sago et al. |
| 5,321,453 A | 6/1994 | Mori et al. | | 5,578,932 A | 11/1996 | Adamian |
| 5,326,412 A | 7/1994 | Schreiber et al. | | 5,583,445 A | 12/1996 | Mullen |
| 5,334,931 A | 8/1994 | Clarke et al. | | 5,584,120 A | 12/1996 | Roberts |
| 5,347,204 A | 9/1994 | Gregory et al. | | 5,584,608 A | 12/1996 | Gillespie |
| 5,355,079 A | 10/1994 | Evans et al. | | 5,589,781 A | 12/1996 | Higgins et al. |
| 5,357,211 A | 10/1994 | Bryson et al. | | 5,594,358 A | 1/1997 | Ishikawa et al. |
| 5,360,312 A | 11/1994 | Mozingo | | 5,600,256 A | 2/1997 | Woith et al. |
| 5,361,049 A | 11/1994 | Rubin et al. | | 5,601,740 A | 2/1997 | Eldridge et al. |
| 5,363,050 A | 11/1994 | Guo et al. | | 5,610,529 A | 3/1997 | Schwindt |
| 5,367,165 A | 11/1994 | Toda et al. | | 5,611,008 A | 3/1997 | Yap |
| 5,369,368 A | 11/1994 | Kassen et al. | | 5,617,035 A | 4/1997 | Swapp |
| 5,371,654 A | 12/1994 | Beaman et al. | | 5,621,333 A | 4/1997 | Long et al. |
| 5,373,231 A | 12/1994 | Boll et al. | | 5,621,400 A | 4/1997 | Corbi |
| 5,374,938 A | 12/1994 | Hatazawa et al. | | 5,623,213 A | 4/1997 | Liu et al. |
| 5,376,790 A | 12/1994 | Linker et al. | | 5,623,214 A | 4/1997 | Pasiecznik, Jr. |
| 5,383,787 A | 1/1995 | Switky et al. | | 5,627,473 A | 5/1997 | Takami |
| 5,389,885 A | 2/1995 | Swart | | 5,628,057 A | 5/1997 | Phillips et al. |
| 5,395,253 A | 3/1995 | Crumly | | 5,629,838 A * | 5/1997 | Knight et al. ............... 361/782 |
| 5,397,855 A | 3/1995 | Ferlier | | 5,631,571 A | 5/1997 | Spaziani et al. |
| 5,404,111 A | 4/1995 | Mori et al. | | 5,633,780 A | 5/1997 | Cronin |
| 5,408,188 A | 4/1995 | Katoh | | 5,635,846 A | 6/1997 | Beaman et al. |
| 5,408,189 A | 4/1995 | Swart et al. | | 5,642,298 A | 6/1997 | Mallory et al. |
| 5,412,330 A | 5/1995 | Ravel et al. | | 5,644,248 A | 7/1997 | Fujimoto |
| 5,412,866 A | 5/1995 | Woith et al. | | 5,653,939 A | 8/1997 | Hollis et al. |
| 5,414,565 A | 5/1995 | Sullivan et al. | | 5,656,942 A | 8/1997 | Watts et al. |
| 5,422,574 A | 6/1995 | Kister | | 5,659,421 A | 8/1997 | Rahmel et al. |
| 5,430,813 A | 7/1995 | Anderson et al. | | 5,666,063 A | 9/1997 | Abercrombie et al. |
| 5,441,690 A | 8/1995 | Ayala-Esquilin et al. | | 5,669,316 A | 9/1997 | Faz et al. |
| 5,451,884 A | 9/1995 | Sauerland | | 5,670,322 A | 9/1997 | Eggers et al. |
| 5,453,404 A | 9/1995 | Leedy | | 5,670,888 A | 9/1997 | Cheng |
| 5,457,398 A | 10/1995 | Schwindt et al. | | 5,672,816 A | 9/1997 | Park et al. |
| 5,463,324 A | 10/1995 | Wardwell et al. | | 5,675,499 A | 10/1997 | Lee et al. |
| 5,467,024 A | 11/1995 | Swapp | | 5,675,932 A | 10/1997 | Mauney |
| 5,469,324 A | 11/1995 | Henderson et al. | | 5,676,360 A | 10/1997 | Boucher et al. |
| 5,471,185 A | 11/1995 | Shea et al. | | 5,678,210 A | 10/1997 | Hannah |
| 5,475,316 A | 12/1995 | Hurley et al. | | 5,685,232 A | 11/1997 | Inoue |
| 5,476,211 A | 12/1995 | Khandros | | 5,686,317 A | 11/1997 | Akram et al. |
| 5,477,011 A | 12/1995 | Singles et al. | | 5,686,960 A | 11/1997 | Sussman et al. |
| 5,478,748 A | 12/1995 | Akins, Jr. et al. | | 5,688,618 A | 11/1997 | Hulderman et al. |
| 5,479,108 A | 12/1995 | Cheng | | 5,700,844 A | 12/1997 | Hedrick et al. |
| 5,479,109 A | 12/1995 | Lau et al. | | 5,704,355 A | 1/1998 | Bridges |
| 5,481,196 A | 1/1996 | Nosov | | 5,715,819 A | 2/1998 | Svenson et al. |
| 5,481,936 A | 1/1996 | Yanagisawa | | 5,720,098 A | 2/1998 | Kister |
| 5,487,999 A | 1/1996 | Farnworth | | 5,723,347 A | 3/1998 | Kirano et al. |
| 5,488,954 A | 2/1996 | Sleva et al. | | 5,726,211 A | 3/1998 | Hedrick et al. |
| 5,491,425 A | 2/1996 | Watanabe et al. | | 5,728,091 A | 3/1998 | Payne et al. |
| 5,493,070 A | 2/1996 | Habu | | 5,729,150 A | 3/1998 | Schwindt |
| 5,493,236 A | 2/1996 | Ishii et al. | | 5,731,920 A | 3/1998 | Katsuragawa |
| 5,500,606 A | 3/1996 | Holmes | | 5,742,174 A | 4/1998 | Kister et al. |
| 5,505,150 A | 4/1996 | James et al. | | 5,744,971 A | 4/1998 | Chan et al. |
| 5,506,498 A | 4/1996 | Anderson et al. | | 5,748,506 A | 5/1998 | Bockelman |
| 5,506,515 A | 4/1996 | Godshalk et al. | | 5,751,153 A | 5/1998 | Bockelman |
| 5,507,652 A | 4/1996 | Wardwell | | 5,751,252 A | 5/1998 | Phillips |
| 5,510,792 A | 4/1996 | Ono et al. | | 5,756,021 A | 5/1998 | Bedrick et al. |
| 5,511,010 A | 4/1996 | Burns | | 5,756,908 A | 5/1998 | Knollmeyer et al. |
| 5,512,835 A | 4/1996 | Rivera et al. | | 5,764,070 A | 6/1998 | Pedder |
| 5,517,126 A | 5/1996 | Yamaguchi | | 5,767,690 A | 6/1998 | Fujimoto |
| 5,521,518 A | 5/1996 | Higgins | | 5,772,451 A | 6/1998 | Dozier, II et al. |
| 5,521,522 A | 5/1996 | Abe et al. | | 5,773,780 A | 6/1998 | Eldridge et al. |
| 5,523,694 A | 6/1996 | Cole, Jr. | | 5,777,485 A | 7/1998 | Tanaka et al. |
| 5,528,158 A | 6/1996 | Sinsheimer et al. | | 5,785,538 A | 7/1998 | Beaman et al. |
| 5,530,372 A | 6/1996 | Lee et al. | | 5,792,668 A | 8/1998 | Fuller et al. |
| 5,531,022 A | 7/1996 | Beaman et al. | | 5,793,213 A | 8/1998 | Bockelman et al. |
| 5,532,608 A | 7/1996 | Behfar-Rad et al. | | 5,794,133 A | 8/1998 | Kashima |
| 5,537,372 A | 7/1996 | Albrecht et al. | | 5,803,607 A | 9/1998 | Jones et al. |
| 5,539,323 A | 7/1996 | Davis, Jr. | | 5,804,607 A | 9/1998 | Hedrick et al. |
| 5,539,676 A | 7/1996 | Yamaguchi | | 5,804,982 A | 9/1998 | Lo et al. |

| | | | | | | |
|---|---|---|---|---|---|---|
| 5,804,983 | A | 9/1998 | Nakajima et al. | 5,998,768 | A | 12/1999 | Hunter et al. |
| 5,806,181 | A | 9/1998 | Khandros et al. | 5,998,864 | A | 12/1999 | Khandros et al. |
| 5,807,107 | A | 9/1998 | Bright et al. | 5,999,268 | A | 12/1999 | Yonezawa et al. |
| 5,808,874 | A | 9/1998 | Smith | 6,001,760 | A | 12/1999 | Katsuda et al. |
| 5,810,607 | A | 9/1998 | Shih et al. | 6,002,426 | A | 12/1999 | Back et al. |
| 5,811,751 | A | 9/1998 | Leona et al. | 6,006,002 | A | 12/1999 | Motok et al. |
| 5,811,982 | A | 9/1998 | Beaman et al. | 6,013,586 | A | 1/2000 | McGhee et al. |
| 5,813,847 | A | 9/1998 | Eroglu et al. | 6,019,612 | A | 2/2000 | Hasegawa et al. |
| 5,814,847 | A | 9/1998 | Shihadeh et al. | 6,023,103 | A | 2/2000 | Chang et al. |
| 5,820,014 | A | 10/1998 | Dozier, II et al. | 6,028,435 | A | 2/2000 | Nikawa |
| 5,821,763 | A | 10/1998 | Beaman et al. | 6,029,344 | A | 2/2000 | Khandros et al. |
| 5,824,494 | A | 10/1998 | Feldberg | 6,031,383 | A | 2/2000 | Streib et al. |
| 5,829,128 | A | 11/1998 | Eldridge et al. | 6,032,356 | A | 3/2000 | Eldridge et al. |
| 5,829,437 | A | 11/1998 | Bridges | 6,032,714 | A | 3/2000 | Fenton |
| 5,831,442 | A | 11/1998 | Heigl | 6,033,935 | A | 3/2000 | Dozier, II et al. |
| 5,832,601 | A | 11/1998 | Eldridge et al. | 6,034,533 | A | 3/2000 | Tervo et al. |
| 5,833,601 | A | 11/1998 | Swartz et al. | 6,037,785 | A | 3/2000 | Higgins |
| 5,838,160 | A | 11/1998 | Beaman et al. | 6,040,739 | A | 3/2000 | Wedeen et al. |
| 5,841,288 | A | 11/1998 | Meaney et al. | 6,042,712 | A | 3/2000 | Mathieu |
| 5,841,342 | A | 11/1998 | Hegmann et al. | 6,043,563 | A | 3/2000 | Eldridge et al. |
| 5,846,708 | A | 12/1998 | Hollis et al. | 6,046,599 | A | 4/2000 | Long et al. |
| 5,847,569 | A | 12/1998 | Ho et al. | 6,049,216 | A | 4/2000 | Yang et al. |
| 5,848,500 | A | 12/1998 | Kirk | 6,049,976 | A | 4/2000 | Khandros |
| 5,852,232 | A | 12/1998 | Samsavar et al. | 6,050,829 | A | 4/2000 | Eldridge et al. |
| 5,852,871 | A | 12/1998 | Khandros | 6,051,422 | A | 4/2000 | Kovacs et al. |
| 5,854,608 | A | 12/1998 | Leisten | 6,052,653 | A | 4/2000 | Mazur et al. |
| 5,864,946 | A | 2/1999 | Eldridge et al. | 6,054,651 | A | 4/2000 | Fogel et al. |
| 5,867,073 | A | 2/1999 | Weinreb et al. | 6,054,869 | A | 4/2000 | Hutton et al. |
| 5,869,326 | A | 2/1999 | Hofmann | 6,059,982 | A | 5/2000 | Palagonia et al. |
| 5,869,974 | A | 2/1999 | Akram et al. | 6,060,888 | A | 5/2000 | Blackham et al. |
| 5,874,361 | A | 2/1999 | Collins et al. | 6,060,892 | A | 5/2000 | Yamagata |
| 5,876,082 | A | 3/1999 | Kempf et al. | 6,061,589 | A | 5/2000 | Bridges et al. |
| 5,878,486 | A | 3/1999 | Eldridge et al. | 6,062,879 | A | 5/2000 | Beaman et al. |
| 5,879,289 | A | 3/1999 | Yarush et al. | 6,064,213 | A | 5/2000 | Khandros et al. |
| 5,883,522 | A | 3/1999 | O'Boyle | 6,064,217 | A | 5/2000 | Smith |
| 5,883,523 | A | 3/1999 | Ferland et al. | 6,064,218 | A | 5/2000 | Godfrey et al. |
| 5,884,398 | A | 3/1999 | Eldridge et al. | 6,066,911 | A | 5/2000 | Lindemann et al. |
| 5,888,075 | A | 3/1999 | Hasegawa et al. | 6,071,009 | A | 6/2000 | Clyne |
| 5,892,539 | A | 4/1999 | Colvin | 6,078,183 | A | 6/2000 | Cole, Jr. |
| 5,896,038 | A | 4/1999 | Budnaitis et al. | 6,078,500 | A | 6/2000 | Beaman et al. |
| 5,900,737 | A | 5/1999 | Graham et al. | 6,090,261 | A | 7/2000 | Mathieu |
| 5,900,738 | A | 5/1999 | Khandros et al. | 6,091,236 | A | 7/2000 | Piety et al. |
| 5,903,143 | A | 5/1999 | Mochizuki et al. | 6,091,255 | A | 7/2000 | Godfrey |
| 5,905,421 | A | 5/1999 | Oldfield | 6,091,256 | A | 7/2000 | Long et al. |
| 5,910,727 | A | 6/1999 | Fujihara et al. | 6,096,567 | A | 8/2000 | Kaplan et al. |
| 5,912,046 | A | 6/1999 | Eldridge et al. | 6,100,815 | A | 8/2000 | Pailthorp |
| 5,914,613 | A | 6/1999 | Gleason et al. | 6,104,201 | A | 8/2000 | Beaman et al. |
| 5,914,614 | A | 6/1999 | Beaman et al. | 6,104,206 | A | 8/2000 | Verkuil |
| 5,916,689 | A | 6/1999 | Collins et al. | 6,110,823 | A | 8/2000 | Eldridge et al. |
| 5,917,707 | A | 6/1999 | Khandros et al. | 6,114,864 | A | 9/2000 | Soejima et al. |
| 5,923,180 | A | 7/1999 | Botka et al. | 6,114,865 | A | 9/2000 | Lagowski et al. |
| 5,926,029 | A | 7/1999 | Ference et al. | 6,118,287 | A | 9/2000 | Boll et al. |
| 5,926,951 | A | 7/1999 | Khandros et al. | 6,118,894 | A | 9/2000 | Schwartz et al. |
| 5,940,965 | A | 8/1999 | Uhling et al. | 6,121,836 | A | 9/2000 | Vallencourt |
| 5,944,093 | A | 8/1999 | Viswanath | 6,124,725 | A | 9/2000 | Sato |
| 5,945,836 | A | 8/1999 | Sayre et al. | 6,127,831 | A | 10/2000 | Khoury et al. |
| 5,949,383 | A | 9/1999 | Hayes et al. | 6,130,536 | A | 10/2000 | Powell et al. |
| 5,949,579 | A | 9/1999 | Baker | 6,137,302 | A | 10/2000 | Schwindt |
| 5,959,461 | A | 9/1999 | Brown et al. | 6,144,212 | A | 11/2000 | Mizuta |
| 5,963,364 | A | 10/1999 | Leong et al. | 6,146,908 | A | 11/2000 | Falque et al. |
| 5,966,645 | A | 10/1999 | Davis | 6,147,502 | A | 11/2000 | Fryer et al. |
| 5,970,429 | A | 10/1999 | Martin | 6,147,851 | A | 11/2000 | Anderson |
| 5,973,504 | A | 10/1999 | Chong | 6,150,186 | A | 11/2000 | Chen et al. |
| 5,974,662 | A | 11/1999 | Eldridge et al. | 6,160,407 | A | 12/2000 | Nikawa |
| 5,977,783 | A | 11/1999 | Takayama et al. | 6,166,553 | A | 12/2000 | Sinsheimer |
| 5,981,268 | A | 11/1999 | Kovacs et al. | 6,168,974 | B1 | 1/2001 | Chang et al. |
| 5,982,166 | A | 11/1999 | Mautz | 6,169,410 | B1 | 1/2001 | Grace et al. |
| 5,983,493 | A | 11/1999 | Eldridge et al. | 6,172,337 | B1 | 1/2001 | Johnsgard et al. |
| 5,993,611 | A | 11/1999 | Moroney, III et al. | 6,174,744 | B1 | 1/2001 | Watanabe et al. |
| 5,994,152 | A | 11/1999 | Khandros et al. | 6,175,228 | B1 | 1/2001 | Zamborelli et al. |
| 5,995,914 | A | 11/1999 | Cabot | 6,181,144 | B1 | 1/2001 | Hembree et al. |
| 5,996,102 | A | 11/1999 | Haulin | 6,181,149 | B1 | 1/2001 | Godfrey et al. |
| 5,998,228 | A | 12/1999 | Eldridge et al. | 6,181,297 | B1 | 1/2001 | Leisten |

| | | | |
|---|---|---|---|
| 6,181,416 B1 | 1/2001 | Falk | |
| 6,184,053 B1 | 2/2001 | Eldridge et al. | |
| 6,184,587 B1 | 2/2001 | Khandros et al. | |
| 6,184,845 B1 | 2/2001 | Leisten et al. | |
| 6,191,596 B1 | 2/2001 | Abiko | |
| 6,194,720 B1 | 2/2001 | Li et al. | |
| 6,201,453 B1 | 3/2001 | Chan et al. | |
| 6,206,273 B1 | 3/2001 | Beaman et al. | |
| 6,208,225 B1 | 3/2001 | Miller | |
| RE37,130 E * | 4/2001 | Fiori, Jr. ................ 330/69 | |
| 6,211,663 B1 | 4/2001 | Moulthrop et al. | |
| 6,211,837 B1 | 4/2001 | Crouch et al. | |
| 6,215,196 B1 | 4/2001 | Eldridge et al. | |
| 6,215,295 B1 | 4/2001 | Smith, III | |
| 6,215,670 B1 | 4/2001 | Khandros | |
| 6,218,910 B1 | 4/2001 | Miller | |
| 6,222,031 B1 | 4/2001 | Wakabayashi et al. | |
| 6,222,970 B1 | 4/2001 | Wach et al. | |
| 6,229,327 B1 | 5/2001 | Boll et al. | |
| 6,232,149 B1 | 5/2001 | Dozier, II et al. | |
| 6,232,787 B1 | 5/2001 | Lo et al. | |
| 6,232,788 B1 | 5/2001 | Schwindt et al. | |
| 6,232,789 B1 | 5/2001 | Schwindt | |
| 6,233,613 B1 | 5/2001 | Walker et al. | |
| 6,236,223 B1 | 5/2001 | Brady et al. | |
| 6,242,803 B1 | 6/2001 | Khandros et al. | |
| 6,242,929 B1 | 6/2001 | Mizuta | |
| 6,245,692 B1 | 6/2001 | Pearce et al. | |
| 6,246,247 B1 | 6/2001 | Eldridge et al. | |
| 6,251,595 B1 | 6/2001 | Gordon et al. | |
| 6,255,126 B1 | 7/2001 | Mathieu et al. | |
| 6,256,882 B1 | 7/2001 | Gleason et al. | |
| 6,257,564 B1 | 7/2001 | Avneri et al. | |
| 6,259,260 B1 | 7/2001 | Smith et al. | |
| 6,265,950 B1 | 7/2001 | Schmidt et al. | |
| 6,268,015 B1 | 7/2001 | Mathieu et al. | |
| 6,268,016 B1 | 7/2001 | Bhatt et al. | |
| 6,271,673 B1 | 8/2001 | Furuta et al. | |
| 6,274,823 B1 | 8/2001 | Khandros et al. | |
| 6,275,043 B1 | 8/2001 | Muhlberger et al. | |
| 6,275,738 B1 | 8/2001 | Kasevich et al. | |
| 6,278,051 B1 | 8/2001 | Peabody | |
| 6,278,411 B1 | 8/2001 | Ohlsson et al. | |
| 6,281,691 B1 | 8/2001 | Matsunaga et al. | |
| 6,286,208 B1 | 9/2001 | Shih et al. | |
| 6,292,760 B1 | 9/2001 | Burns | |
| 6,295,729 B1 | 10/2001 | Beaman et al. | |
| 6,300,775 B1 | 10/2001 | Peach et al. | |
| 6,300,780 B1 | 10/2001 | Beaman et al. | |
| 6,307,161 B1 | 10/2001 | Grube et al. | |
| 6,307,363 B1 | 10/2001 | Anderson | |
| 6,307,672 B1 | 10/2001 | DeNure | |
| 6,310,483 B1 | 10/2001 | Taura et al. | |
| 6,320,372 B1 | 11/2001 | Keller | |
| 6,320,396 B1 | 11/2001 | Nikawa | |
| 6,327,034 B1 | 12/2001 | Hoover et al. | |
| 6,329,827 B1 | 12/2001 | Beaman et al. | |
| 6,330,164 B1 | 12/2001 | Khandros et al. | |
| 6,332,270 B2 | 12/2001 | Beaman et al. | |
| 6,334,247 B1 | 1/2002 | Beaman et al. | |
| 6,335,625 B1 | 1/2002 | Bryant et al. | |
| 6,339,338 B1 | 1/2002 | Eldridge et al. | |
| 6,340,568 B2 | 1/2002 | Hefti | |
| 6,340,895 B1 | 1/2002 | Uher et al. | |
| 6,351,885 B2 | 3/2002 | Suzuki et al. | |
| 6,352,454 B1 | 3/2002 | Kim et al. | |
| 6,359,456 B1 | 3/2002 | Hembree et al. | |
| 6,362,792 B1 | 3/2002 | Sawamura et al. | |
| 6,366,247 B1 | 4/2002 | Sawamura et al. | |
| 6,369,776 B1 | 4/2002 | Leisten et al. | |
| 6,376,258 B2 | 4/2002 | Hefti | |
| 6,384,614 B1 | 5/2002 | Hager et al. | |
| 6,384,615 B2 | 5/2002 | Schwindt | |
| 6,388,455 B1 | 5/2002 | Kamieniecki et al. | |
| 6,395,480 B1 | 5/2002 | Hefti | |
| 6,396,296 B1 | 5/2002 | Tartar et al. | |
| 6,396,298 B1 | 5/2002 | Young et al. | |
| 6,400,168 B2 | 6/2002 | Matsunaga et al. | |
| 6,404,213 B2 | 6/2002 | Noda | |
| 6,407,542 B1 | 6/2002 | Conte | |
| 6,407,562 B1 | 6/2002 | Whiteman | |
| 6,409,724 B1 | 6/2002 | Penny et al. | |
| 6,414,478 B1 | 7/2002 | Suzuki | |
| 6,415,858 B1 | 7/2002 | Getchel et al. | |
| 6,418,009 B1 | 7/2002 | Brunette | |
| 6,420,722 B2 | 7/2002 | Moore et al. | |
| 6,424,316 B1 | 7/2002 | Leisten et al. | |
| 6,429,029 B1 | 8/2002 | Eldridge et al. | |
| 6,441,315 B1 | 8/2002 | Eldridge et al. | |
| 6,442,831 B1 | 9/2002 | Khandros et al. | |
| 6,447,339 B1 | 9/2002 | Reed et al. | |
| 6,448,788 B1 | 9/2002 | Meaney et al. | |
| 6,448,865 B1 | 9/2002 | Miller | |
| 6,452,406 B1 | 9/2002 | Beaman et al. | |
| 6,452,411 B1 | 9/2002 | Miller et al. | |
| 6,456,099 B1 | 9/2002 | Eldridge et al. | |
| 6,456,103 B1 | 9/2002 | Eldridge et al. | |
| 6,459,343 B1 | 10/2002 | Miller | |
| 6,459,739 B1 * | 10/2002 | Vitenberg ................ 375/258 | |
| 6,468,098 B1 | 10/2002 | Eldridge | |
| 6,475,822 B2 | 11/2002 | Eldridge | |
| 6,476,333 B1 | 11/2002 | Khandros et al. | |
| 6,476,442 B1 | 11/2002 | Williams et al. | |
| 6,476,630 B1 | 11/2002 | Whitten et al. | |
| 6,479,308 B1 | 11/2002 | Eldridge | |
| 6,480,013 B1 | 11/2002 | Nayler et al. | |
| 6,480,978 B1 | 11/2002 | Roy et al. | |
| 6,481,939 B1 | 11/2002 | Gillespie et al. | |
| 6,482,013 B2 | 11/2002 | Eldridge et al. | |
| 6,483,327 B1 | 11/2002 | Bruce et al. | |
| 6,488,405 B1 | 12/2002 | Eppes et al. | |
| 6,490,471 B2 | 12/2002 | Svenson et al. | |
| 6,491,968 B1 | 12/2002 | Mathieu et al. | |
| 6,496,024 B2 | 12/2002 | Schwindt | |
| 6,499,121 B1 | 12/2002 | Roy et al. | |
| 6,501,343 B2 | 12/2002 | Miller | |
| 6,509,751 B1 | 1/2003 | Mathieu et al. | |
| 6,512,482 B1 | 1/2003 | Nelson et al. | |
| 6,520,778 B1 | 2/2003 | Eldridge et al. | |
| 6,525,555 B1 | 2/2003 | Khandros et al. | |
| 6,526,655 B2 | 3/2003 | Beaman et al. | |
| 6,528,984 B2 | 3/2003 | Beaman et al. | |
| 6,528,993 B1 | 3/2003 | Shin et al. | |
| 6,529,844 B1 | 3/2003 | Kapetanic et al. | |
| 6,534,856 B1 | 3/2003 | Dozier, II et al. | |
| 6,538,214 B2 | 3/2003 | Khandros | |
| 6,538,538 B2 | 3/2003 | Hreish et al. | |
| 6,539,531 B2 | 3/2003 | Miller et al. | |
| 6,548,311 B1 | 4/2003 | Knoll | |
| 6,549,022 B1 | 4/2003 | Cole, Jr. et al. | |
| 6,549,106 B2 | 4/2003 | Martin | |
| 6,551,884 B2 | 4/2003 | Masuoka | |
| 6,559,671 B2 | 5/2003 | Miller et al. | |
| 6,566,079 B2 | 5/2003 | Hefti | |
| 6,572,608 B1 | 6/2003 | Lee et al. | |
| 6,573,702 B2 | 6/2003 | Marcuse et al. | |
| 6,578,264 B1 | 6/2003 | Gleason et al. | |
| 6,580,283 B1 | 6/2003 | Carbone et al. | |
| 6,582,979 B2 | 6/2003 | Coccioli et al. | |
| 6,587,327 B1 | 7/2003 | Devoe et al. | |
| 6,597,187 B2 | 7/2003 | Eldridge et al. | |
| 6,603,322 B1 | 8/2003 | Boll et al. | |
| 6,603,323 B1 | 8/2003 | Miller et al. | |
| 6,603,324 B2 | 8/2003 | Eldridge et al. | |
| 6,605,941 B2 | 8/2003 | Abe | |
| 6,605,951 B1 | 8/2003 | Cowan | |

| | | | |
|---|---|---|---|
| 6,605,955 B1 | 8/2003 | Costello et al. | |
| 6,606,014 B2 | 8/2003 | Miller | |
| 6,606,575 B2 | 8/2003 | Miller | |
| 6,608,494 B1 | 8/2003 | Bruce et al. | |
| 6,611,417 B2 | 8/2003 | Chen | |
| 6,615,485 B2 | 9/2003 | Eldridge et al. | |
| 6,616,966 B2 | 9/2003 | Mathieu et al. | |
| 6,617,862 B1 | 9/2003 | Bruce | |
| 6,617,866 B1 | 9/2003 | Ickes | |
| 6,621,082 B2 | 9/2003 | Morita et al. | |
| 6,621,260 B2 | 9/2003 | Eldridge et al. | |
| 6,622,103 B1 | 9/2003 | Miller | |
| 6,624,648 B2 | 9/2003 | Eldridge et al. | |
| 6,627,461 B2 | 9/2003 | Chapman et al. | |
| 6,627,483 B2 | 9/2003 | Ondricek et al. | |
| 6,627,980 B2 | 9/2003 | Eldridge | |
| 6,628,503 B2 | 9/2003 | Sogard | |
| 6,628,980 B2 | 9/2003 | Atalar et al. | |
| 6,633,174 B1 | 10/2003 | Satya et al. | |
| 6,636,182 B2 | 10/2003 | Mehltretter | |
| 6,639,461 B1 | 10/2003 | Tam et al. | |
| 6,640,415 B2 | 11/2003 | Eslamy et al. | |
| 6,640,432 B1 | 11/2003 | Mathieu et al. | |
| 6,642,625 B2 | 11/2003 | Dozier, II et al. | |
| 6,643,597 B1 | 11/2003 | Dunsmore | |
| 6,644,982 B1 | 11/2003 | Ondricek et al. | |
| 6,646,520 B2 | 11/2003 | Miller | |
| 6,653,903 B2 | 11/2003 | Leich et al. | |
| 6,655,023 B1 | 12/2003 | Eldridge et al. | |
| 6,657,455 B2 | 12/2003 | Eldridge et al. | |
| 6,657,601 B2 | 12/2003 | McLean | |
| 6,661,316 B2 | 12/2003 | Hreish et al. | |
| 6,664,628 B2 | 12/2003 | Khandros et al. | |
| 6,669,489 B1 | 12/2003 | Dozier, II et al. | |
| 6,672,875 B1 | 1/2004 | Mathieu et al. | |
| 6,677,744 B1 | 1/2004 | Long | |
| 6,678,850 B2 | 1/2004 | Roy et al. | |
| 6,678,876 B2 | 1/2004 | Stevens et al. | |
| 6,680,659 B2 | 1/2004 | Miller | |
| 6,685,817 B1 | 2/2004 | Mathieu | |
| 6,686,754 B2 | 2/2004 | Miller | |
| 6,690,185 B1 | 2/2004 | Khandros et al. | |
| 6,701,265 B2 | 3/2004 | Hill et al. | |
| 6,701,612 B2 | 3/2004 | Khandros et al. | |
| 6,707,548 B2 | 3/2004 | Kreimer et al. | |
| 6,708,403 B2 | 3/2004 | Beaman et al. | |
| 6,710,798 B1 | 3/2004 | Hershel et al. | |
| 6,713,374 B2 | 3/2004 | Eldridge et al. | |
| 6,714,828 B2 | 3/2004 | Eldridge et al. | |
| 6,717,426 B2 | 4/2004 | Iwasaki | |
| 6,720,501 B1 | 4/2004 | Henson | |
| 6,722,032 B2 | 4/2004 | Beaman et al. | |
| 6,724,205 B1 | 4/2004 | Hayden et al. | |
| 6,724,928 B1 | 4/2004 | Davis | |
| 6,727,579 B1 | 4/2004 | Eldridge et al. | |
| 6,727,580 B1 | 4/2004 | Eldridge et al. | |
| 6,727,716 B1 | 4/2004 | Sharif | |
| 6,729,019 B2 | 5/2004 | Grube et al. | |
| 6,731,804 B1 | 5/2004 | Carrieri et al. | |
| 6,734,687 B1 | 5/2004 | Ishitani et al. | |
| 6,737,920 B2 | 5/2004 | Jen et al. | |
| 6,741,085 B1 | 5/2004 | Khandros et al. | |
| 6,741,092 B2 | 5/2004 | Eldridge et al. | |
| 6,741,129 B1 * | 5/2004 | Corsi et al. | 330/252 |
| 6,744,268 B2 | 6/2004 | Hollman | |
| 6,753,679 B1 | 6/2004 | Kwong et al. | |
| 6,753,699 B2 | 6/2004 | Stockstad | |
| 6,759,311 B2 | 7/2004 | Eldridge et al. | |
| 6,759,859 B2 | 7/2004 | Deng et al. | |
| 6,764,869 B2 | 7/2004 | Eldridge et al. | |
| 6,768,328 B2 | 7/2004 | Self et al. | |
| 6,770,955 B1 | 8/2004 | Coccioli et al. | |
| 6,771,806 B1 | 8/2004 | Satya et al. | |
| 6,777,319 B2 | 8/2004 | Grube et al. | |
| 6,778,140 B2 | 8/2004 | Yeh | |
| 6,778,406 B2 | 8/2004 | Eldridge et al. | |
| 6,780,001 B2 | 8/2004 | Eldridge et al. | |
| 6,784,674 B2 | 8/2004 | Miller | |
| 6,784,677 B2 | 8/2004 | Miller | |
| 6,784,679 B2 | 8/2004 | Sweet et al. | |
| 6,788,093 B2 | 9/2004 | Aitren et al. | |
| 6,788,094 B2 | 9/2004 | Khandros et al. | |
| 6,791,176 B2 | 9/2004 | Mathieu et al. | |
| 6,794,888 B2 | 9/2004 | Kawaguchi et al. | |
| 6,794,934 B2 * | 9/2004 | Betti-Berutto et al. | 330/124 R |
| 6,794,950 B2 | 9/2004 | Du Toit et al. | |
| 6,798,225 B2 | 9/2004 | Miller | |
| 6,798,226 B2 | 9/2004 | Altmann et al. | |
| 6,806,724 B2 | 10/2004 | Hayden et al. | |
| 6,806,836 B2 | 10/2004 | Ogawa et al. | |
| 6,807,734 B2 | 10/2004 | Eldridge et al. | |
| 6,809,533 B1 | 10/2004 | Anlage et al. | |
| 6,811,406 B2 | 11/2004 | Grube | |
| 6,812,691 B2 | 11/2004 | Miller | |
| 6,812,718 B1 | 11/2004 | Chong et al. | |
| 6,815,963 B2 | 11/2004 | Gleason et al. | |
| 6,816,031 B1 | 11/2004 | Miller | |
| 6,816,840 B1 | 11/2004 | Goodwin, III | |
| 6,817,052 B2 | 11/2004 | Grube | |
| 6,818,840 B2 | 11/2004 | Khandros | |
| 6,822,463 B1 | 11/2004 | Jacobs | |
| 6,822,529 B2 | 11/2004 | Miller | |
| 6,825,052 B2 | 11/2004 | Eldridge et al. | |
| 6,825,422 B2 | 11/2004 | Eldridge et al. | |
| 6,827,584 B2 | 12/2004 | Mathieu et al. | |
| 6,835,898 B2 | 12/2004 | Eldridge et al. | |
| 6,836,962 B2 | 1/2005 | Khandros et al. | |
| 6,838,885 B2 | 1/2005 | Kamitani | |
| 6,838,893 B2 | 1/2005 | Khandros et al. | |
| 6,839,964 B2 | 1/2005 | Henson | |
| 6,845,491 B2 | 1/2005 | Miller et al. | |
| 6,850,082 B2 | 2/2005 | Schwindt | |
| 6,856,129 B2 | 2/2005 | Thomas et al. | |
| 6,856,150 B2 | 2/2005 | Sporck et al. | |
| 6,862,727 B2 | 3/2005 | Stevens | |
| 6,864,105 B2 | 3/2005 | Grube et al. | |
| 6,864,694 B2 | 3/2005 | McTigue | |
| 6,870,359 B1 | 3/2005 | Sekel | |
| 6,870,381 B2 | 3/2005 | Grube | |
| 6,882,239 B2 | 4/2005 | Miller | |
| 6,882,546 B2 | 4/2005 | Miller | |
| 6,887,723 B1 | 5/2005 | Ondricek et al. | |
| 6,888,362 B2 | 5/2005 | Eldridge et al. | |
| 6,891,385 B2 | 5/2005 | Miller | |
| 6,900,646 B2 | 5/2005 | Kasukabe et al. | |
| 6,900,647 B2 | 5/2005 | Yoshida et al. | |
| 6,900,652 B2 | 5/2005 | Mazur | |
| 6,900,653 B2 | 5/2005 | Yu et al. | |
| 6,902,416 B2 | 6/2005 | Feldman | |
| 6,902,941 B2 | 6/2005 | Sun | |
| 6,903,563 B2 | 6/2005 | Yoshida et al. | |
| 6,906,506 B1 | 6/2005 | Reano et al. | |
| 6,906,539 B2 | 6/2005 | Wilson et al. | |
| 6,906,542 B2 | 6/2005 | Sakagawa et al. | |
| 6,906,543 B2 | 6/2005 | Lou et al. | |
| 6,907,149 B2 | 6/2005 | Slater | |
| 6,908,364 B2 | 6/2005 | Back et al. | |
| 6,909,297 B2 | 6/2005 | Ji et al. | |
| 6,909,300 B2 | 6/2005 | Lu et al. | |
| 6,909,983 B2 | 6/2005 | Sutherland | |
| 6,910,268 B2 | 6/2005 | Miller | |
| 6,911,814 B2 | 6/2005 | Miller et al. | |
| 6,911,826 B2 | 6/2005 | Plotnikov et al. | |
| 6,911,834 B2 | 6/2005 | Mitchell et al. | |
| 6,911,835 B2 | 6/2005 | Chraft et al. | |
| 6,912,468 B2 | 6/2005 | Marin et al. | |

| | | |
|---|---|---|
| 6,913,468 B2 | 7/2005 | Dozier, II et al. |
| 6,914,244 B2 | 7/2005 | Alani |
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijo et al. |
| 6,927,079 B1 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |
| 6,933,737 B2 | 8/2005 | Sugawara |
| 6,937,020 B2 | 8/2005 | Munson et al. |
| 6,937,037 B2 | 8/2005 | Eldridge et al. |
| 6,937,040 B2 | 8/2005 | Maeda et al. |
| 6,937,042 B2 | 8/2005 | Yoshida et al. |
| 6,937,045 B2 | 8/2005 | Sinclair |
| 6,937,341 B1 | 8/2005 | Woollam et al. |
| 6,940,264 B2 | 9/2005 | Ryken, Jr. et al. |
| 6,940,283 B2 | 9/2005 | McQueeney |
| 6,943,563 B2 | 9/2005 | Martens |
| 6,943,571 B2 | 9/2005 | Worledge |
| 6,943,574 B2 | 9/2005 | Altmann et al. |
| 6,944,380 B1 | 9/2005 | Hideo et al. |
| 6,946,859 B2 | 9/2005 | Karavakis et al. |
| 6,946,860 B2 | 9/2005 | Cheng et al. |
| 6,946,864 B2 | 9/2005 | Gramann et al. |
| 6,948,391 B2 | 9/2005 | Brassell et al. |
| 6,948,981 B2 | 9/2005 | Pade |
| 6,949,942 B2 | 9/2005 | Eldridge et al. |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,328 B1 | 4/2006 | Beerling |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,057,404 B2 | 6/2006 | Gleason et al. |
| 7,071,722 B2 | 7/2006 | Yamada et al. |
| 7,088,981 B2 | 8/2006 | Chang |
| 7,096,133 B1 | 8/2006 | Martin et al. |
| 7,161,363 B2 | 1/2007 | Gleason et al. |
| 7,173,433 B2 | 2/2007 | Hoshi et al. |
| 7,187,188 B2 | 3/2007 | Andrews et al. |
| 7,188,037 B2 | 3/2007 | Hidehira |
| 7,219,416 B2 | 5/2007 | Inoue et al. |
| 7,233,160 B2 | 6/2007 | Hayden et al. |
| 7,253,646 B2 | 8/2007 | Lou et al. |
| 7,271,603 B2 | 9/2007 | Gleason et al. |
| 7,276,922 B2 | 10/2007 | Miller et al. |
| 7,315,175 B2 | 1/2008 | Cole |
| 7,319,335 B2 | 1/2008 | Brunner et al. |
| 7,319,337 B2 | 1/2008 | Sakata |
| 7,323,680 B2 | 1/2008 | Chong |
| 7,323,899 B2 | 1/2008 | Schuette et al. |
| 7,327,153 B2 | 2/2008 | Weinraub |
| 7,332,918 B2 | 2/2008 | Sugiyama, et al. |
| 7,332,923 B2 | 2/2008 | Schott, et al. |
| 7,342,402 B2 | 3/2008 | Kim et al. |
| 7,403,028 B2 | 7/2008 | Campbell |
| 2001/0002794 A1 | 6/2001 | Draving et al. |
| 2001/0009061 A1 | 7/2001 | Gleason et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0030480 A1 | 3/2002 | Appen et al. |
| 2002/0050828 A1 | 5/2002 | Seward, IV et al. |
| 2002/0070743 A1 | 6/2002 | Felici et al. |
| 2002/0070745 A1 | 6/2002 | Johnson et al. |
| 2002/0079911 A1 | 6/2002 | Schwindt |
| 2002/0105396 A1 | 8/2002 | Streeter et al. |
| 2002/0109088 A1 | 8/2002 | Nara et al. |
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0176160 A1 | 11/2002 | Suzuki et al. |
| 2002/0180466 A1 | 12/2002 | Hiramatsu et al. |

| | | |
|---|---|---|
| 2002/0197709 A1 | 12/2002 | Van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0062915 A1 | 4/2003 | Arnold et al. |
| 2003/0072549 A1 | 4/2003 | Facer et al. |
| 2003/0076585 A1 | 4/2003 | Ledley |
| 2003/0077649 A1 | 4/2003 | Cho et al. |
| 2003/0088180 A1 | 5/2003 | VanVeen et al. |
| 2003/0119057 A1 | 6/2003 | Gascoyne et al. |
| 2003/0139662 A1 | 7/2003 | Seldman |
| 2003/0139790 A1 | 7/2003 | Ingle et al. |
| 2003/0155939 A1 | 8/2003 | Lutz et al. |
| 2003/0170898 A1 | 9/2003 | Gunderson et al. |
| 2003/0184332 A1 | 10/2003 | Tomimatsu et al. |
| 2003/0215966 A1 | 11/2003 | Rolda et al. |
| 2003/0234659 A1 | 12/2003 | Zieleman |
| 2004/0015060 A1 | 1/2004 | Samsoondar et al. |
| 2004/0021475 A1 | 2/2004 | Ito et al. |
| 2004/0029425 A1 | 2/2004 | Yean et al. |
| 2004/0061514 A1 | 4/2004 | Schwindt et al. |
| 2004/0066181 A1 | 4/2004 | Thies |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0140819 A1 | 7/2004 | McTigue et al. |
| 2004/0147034 A1 | 7/2004 | Gore et al. |
| 2004/0162689 A1 | 8/2004 | Jamneala et al. |
| 2004/0170312 A1 | 9/2004 | Soenksen |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0201388 A1 | 10/2004 | Barr |
| 2004/0207072 A1 | 10/2004 | Hiramatsu et al. |
| 2004/0207424 A1 | 10/2004 | Hollman |
| 2004/0239338 A1 | 12/2004 | Jonsson et al. |
| 2004/0246004 A1 | 12/2004 | Heuermann |
| 2004/0251922 A1 | 12/2004 | Martens et al. |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0068054 A1 | 3/2005 | Mok et al. |
| 2005/0083130 A1 | 4/2005 | Grilo |
| 2005/0088191 A1 | 4/2005 | Lesher |
| 2005/0101846 A1 | 5/2005 | Fine et al. |
| 2005/0116730 A1 | 6/2005 | Hsu |
| 2005/0142033 A1 | 6/2005 | Glezer et al. |
| 2005/0151548 A1 | 7/2005 | Hayden et al. |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0172703 A1 | 8/2005 | Kley |
| 2005/0174191 A1 | 8/2005 | Brunker et al. |
| 2005/0178980 A1 | 8/2005 | Skidmore et al. |
| 2005/0179444 A1 | 8/2005 | Tiemeijer |
| 2005/0195124 A1 | 9/2005 | Puente Baliarda et al. |
| 2005/0229053 A1 | 10/2005 | Sunter |
| 2005/0236587 A1 | 10/2005 | Kodama et al. |
| 2005/0237102 A1 | 10/2005 | Tanaka |
| 2006/0030060 A1 | 2/2006 | Noguchi et al. |
| 2006/0052075 A1 | 3/2006 | Galivanche et al. |
| 2006/0155270 A1 | 7/2006 | Hancock et al. |
| 2006/0184041 A1 | 8/2006 | Andrews et al. |
| 2006/0220663 A1 | 10/2006 | Oikawa |
| 2006/0226864 A1 | 10/2006 | Kramer |
| 2007/0024506 A1 | 2/2007 | Hardacker |
| 2007/0030021 A1 | 2/2007 | Cowan et al. |
| 2007/0145989 A1 | 6/2007 | Zhu et al. |
| 2008/0111571 A1 | 5/2008 | Smith et al. |

FOREIGN PATENT DOCUMENTS

| | | |
|---|---|---|
| CN | 1083975 | 3/1994 |
| DE | 2951072 | 7/1981 |
| DE | 3426565 | 1/1986 |
| DE | 3637549 | 5/1988 |
| DE | 288234 | 3/1991 |
| DE | 4223658 | 1/1993 |
| DE | 9313420 | 10/1993 |
| DE | 19522774 | 1/1997 |
| DE | 19542955 | 2/1997 |
| DE | 19618717 | 1/1998 |
| DE | 19749687 | 5/1998 |
| DE | 29809568 | 10/1998 |
| DE | 10000324 | 7/2001 |
| DE | 20220754 | 5/2004 |
| EP | 0230766 | 12/1985 |
| EP | 0195520 | 9/1986 |
| EP | 0230348 | 7/1987 |
| EP | 0259163 | 3/1988 |
| EP | 0259942 | 3/1988 |
| EP | 0261986 | 3/1988 |
| EP | 0270422 | 6/1988 |
| EP | 0259183 | 9/1988 |
| EP | 0333521 | 9/1989 |
| EP | 0460911 | 12/1991 |
| EP | 0846476 | 6/1998 |
| EP | 0 945 736 | 9/1999 |
| EP | 0945736 | 9/1999 |
| GB | 579665 | 8/1945 |
| GB | 2014315 | 8/1979 |
| GB | 2179458 | 4/1987 |
| JP | 53-037077 | 4/1978 |
| JP | 53037077 | 4/1978 |
| JP | 53-052354 | 5/1978 |
| JP | 55-115383 | 9/1980 |
| JP | 55115383 | 9/1980 |
| JP | 56-007439 | 1/1981 |
| JP | 56-88333 | 7/1981 |
| JP | 5691503 | 7/1981 |
| JP | 56088333 | 7/1981 |
| JP | 57-075480 | 5/1982 |
| JP | 57075480 | 5/1982 |
| JP | 57-163035 | 10/1982 |
| JP | 57163035 | 10/1982 |
| JP | 57171805 | 10/1982 |
| JP | 58-130602 | 8/1983 |
| JP | 594189 U | 1/1984 |
| JP | 60-5462 | 4/1984 |
| JP | 60-236241 | 11/1985 |
| JP | 61142802 | 6/1986 |
| JP | 62-11243 | 1/1987 |
| JP | 62-51235 | 3/1987 |
| JP | 62-58650 | 3/1987 |
| JP | 62-098634 | 5/1987 |
| JP | 62-107937 | 5/1987 |
| JP | 62098634 | 5/1987 |
| JP | 62107937 | 5/1987 |
| JP | 62-179126 | 8/1987 |
| JP | 62-239050 | 10/1987 |
| JP | 62239050 | 10/1987 |

| | | |
|---|---|---|
| JP | 62295374 | 12/1987 |
| JP | 63-108736 | 5/1988 |
| JP | 63-129640 | 6/1988 |
| JP | 63-143814 | 6/1988 |
| JP | 63-152141 | 6/1988 |
| JP | 63-192246 | 8/1988 |
| JP | 63-318745 | 12/1988 |
| JP | 64-21309 | 2/1989 |
| JP | 1-165968 | 6/1989 |
| JP | 1-214038 | 8/1989 |
| JP | 01209380 | 8/1989 |
| JP | 1-219575 | 9/1989 |
| JP | 1-296167 | 11/1989 |
| JP | 2-22836 | 1/1990 |
| JP | 2-124469 | 5/1990 |
| JP | 2-141681 | 5/1990 |
| JP | 02124469 | 5/1990 |
| JP | 02135804 | 5/1990 |
| JP | 2-191352 | 7/1990 |
| JP | 3-175367 | 7/1991 |
| JP | 3-196206 | 8/1991 |
| JP | 3196206 | 8/1991 |
| JP | 3-228348 | 10/1991 |
| JP | 03228348 | 10/1991 |
| JP | 4-130639 | 5/1992 |
| JP | 04130639 | 5/1992 |
| JP | 4-159043 | 6/1992 |
| JP | 04159043 | 6/1992 |
| JP | 4-206930 | 7/1992 |
| JP | 04206930 | 7/1992 |
| JP | 4-340248 | 11/1992 |
| JP | 5-082631 | 4/1993 |
| JP | 05082631 | 4/1993 |
| JP | 5-113451 | 5/1993 |
| JP | 51-57790 | 6/1993 |
| JP | 5157790 | 6/1993 |
| JP | 51-66893 | 7/1993 |
| JP | 5166893 | 7/1993 |
| JP | 52-19046 | 8/1993 |
| JP | 6-85044 | 3/1994 |
| JP | 60-71425 | 3/1994 |
| JP | 6-102313 | 4/1994 |
| JP | 6-132709 | 5/1994 |
| JP | 6-160236 | 6/1994 |
| JP | 6154238 | 6/1994 |
| JP | 6-295949 | 10/1994 |
| JP | 7-005078 | 1/1995 |
| JP | 7-12871 | 1/1995 |
| JP | 7005078 | 1/1995 |
| JP | 7012871 | 1/1995 |
| JP | 7-201945 | 8/1995 |
| JP | 8-35987 | 2/1996 |
| JP | 8035987 | 2/1996 |
| JP | 8-261898 | 10/1996 |
| JP | 8-330401 | 12/1996 |
| JP | 08330401 | 12/1996 |
| JP | 09127432 | 5/1997 |
| JP | 10-48256 | 2/1998 |
| JP | 10-116866 | 5/1998 |
| JP | 10116866 | 5/1998 |
| JP | 11-023975 | 1/1999 |
| JP | 11004001 | 1/1999 |
| JP | 11023975 | 1/1999 |
| JP | 2000-137120 | 5/2000 |
| JP | 2000-329664 | 11/2000 |
| JP | 2001-33633 | 2/2001 |
| JP | 2001-124676 | 5/2001 |
| JP | 2001-189285 | 7/2001 |
| JP | 2001-189378 | 7/2001 |
| JP | 2002-203879 | 7/2002 |
| JP | 2002-243502 | 8/2002 |
| JP | 2002243502 | 8/2002 |
| JP | 2004-507851 | 3/2004 |
| KR | 2003/0090158 | 11/2003 |
| SU | 843040 | 6/1981 |
| SU | 1195402 | 11/1985 |
| SU | 1327023 | 7/1987 |
| SU | 1392603 | 4/1988 |
| WO | WO80/00101 | 1/1980 |
| WO | WO94/10554 | 5/1994 |
| WO | WO 96/29629 | 1/1996 |
| WO | WO 97/50001 | 12/1997 |
| WO | WO98/07040 | 2/1998 |
| WO | WO 00/73905 | 12/2000 |
| WO | WO01/07207 | 2/2001 |
| WO | WO 01/69656 | 9/2001 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

Mark S. Boguski and Martin W. McIntosh, "Biomedical Informatics for proteomics," insight: review article, Nature 422, 233-237 (2003); doi:10.1038/nature01515.

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No, 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "Insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Waveguide-to-Microstrip Transition With Integrated Blas-T," IEEE Microwave and Wireless Components Letters, vol, 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, at al., "Multimode TRL—A New concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

Cohn, S, "Properties of Ridge Wave Guide," Proceedings of the I.R.E., Aug. 1947, pp. 783-788.

Cohn, Seymour B., "Optimum Design of Stepped Transmission-Line Transformers," I.R.E. Transactions—Microwave Theory and Techniques, No. 3, 1955, pp. 16-21.

Hopper, Samuel, "The Design of Ridged Waveguides," I.R.E. Transactions—Microwave Theory and techniques, No. 5, Oct. 1955, pp. 20-29.

Chen, Tsung-Shan, "Calculation of Parameters of Ridge Waveguides," IRE Transactions on Microwave Theory and Techniques, Jan. 1957, pp. 12-17.

IRE 20.1, Committee Personnel, "IRE Standards on Methods of Measuring Noise in Linear Twoports, 1959," Proc. IRE, vol. 48, pp. 60-68, Jan. 1960, pp. 32-40.

Fukui, H., "Available Power Gain, Noise Figure, and Noise Measure of Two-Ports and Their Graphical Representations," pp. 18-23, Reprinted from IEEE Trans. Circuit Theory, vol. CT-l3, pp. 137-142, Jun. 1966.

Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.

Lane, Richard Q., "The Determination of Device Noise Parameters," Proc. IEEE, vol. 57, Aug. 1969, pp. 1461-1462.

Adamian, Vaheh, et al., "A Novel Procedure for Receiver Noise Characterization," IEEE Transactions on Instrumentaton and Measurement, Jun. 1973.

Daly, P., "Polar Geometry Waveguides by finite-element Methods," IEEE Transactions on Microwave Theory and Technique, vol. MTT-22, No. 3, Mar. 1974, pp. 202-209.

Fink, Donald G., et al., "Electronics Engineers' Handbook," Sec. 17-52 Measurement and Control Circuits, 1975, pp. 17-22-17-27.

Bry, A., et al, "Bypass Capacitor for Chip Probe," IBM Technical Disclosure Bulletin, vol. 18, No. 11, Apr. 1976.

Skobern, J.R., "Subminiature High-Frequency Probe," IBM Technical disclosure Bulletin, vol. 19, No. 10, Mar. 1977.

Berg, William, et al., "Elastomers solve tough problems in high-frequency systems," 2119 EDN vol. 23, Jan. 5, 1978, pp. 36-42.

Eisenhart, R.L., "A Better Microstrip Connector," 1978 IEEE MTT-S International Microwave Symposium Digest, Jun. 27-29, Ottawa, Canada.

Gommlich, Hans, et al., "Verzerrungsmessungen-Wichtige Aufgabe in der Ubertragungstechnik," Elektronik 8/ Apr. 23, 1982, pp. 110-119.

Larock, V., et al., "Automatic Noise Temperature Measurement Through Frequency Variation," IEEE Transactions on Microwave Theory and Techniques, vol. MTT-30, No. 8, Aug. 1982, pp. 1286-1288.

Maury Microwave Corp., "Transistor Test Fixture (TTF) Inserts, Calibration & Check Devices, MT951, MT952, MT953 Series," Advanced Data 4T-002, Sep. 20, 1982, pp. 1-2.

Maury Microwave Corp., "Transistor Test Fixture (TTF)," MT950 Series, Advanced data 4T-001, Oct. 7, 1982.

Abbott, D.A., et al., "Automatic noise figure measurements with computer control and correction," 8054 Radio and Electronic Engineer vol. 52, Oct. 1982, pp. 468-474.

Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.

Adamian, V. et al., "Simplified Noise Evaluation of Microwave Receiver," IEEE Transactions on Instrumentation and Measurement, vol. IM-33, No. 2, Jun. 1984, 136-140.

Pastori, William E., "High accuracy microwave noise figure measurements," 8029 Electronic Engineering 56, No. 1984, pp. 181-189.

Inter-Continental Microwave, "Product Catalog," VMC 1055 Jan. 1986.

Design Technique, "Microstrip Microwave Test Fixture," May 1986.

Cascade Microtech, Inc., "Wide Probe Assembly," Full Scale Drawing, May 29, 1986, 2 pages.

Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.

Sharma, A., "Tunable Waveguide-to-Microstrip Transition for Millimeter-Wave Applications," IEE MTT-S Digest 1987, pp. 353-356.

Izadian, Jamal S., "Unified Design Plans Aid Waveguide Transitions," Microwaves & R&F, May 1987, pp. 213-222.

Mazilu, T., "A Self-Adjusting Waveguide-to-Microstrip Transition," Microwave Journal, Jul. 1987, pp. 133-134.

Carlton, D.E. et al., "Accurate Measurement of High-speed Package and Interconnect Parasitics," IEEE 1988 Custom Integrated Circuits Conference, pp. 23.3.1-23.3.6.

Fraser, Artur, et al., "GHz On-Silicon-Wafer Probing Calibration Methods," Paper 7.6, IEEE 1988 Bipolar Circuits & Technology Meeting, pp. 154-157.

Modolo, John A., et al, "Wafer level high-frequency measurements of photodetector characteristics," Applied Optics, vol. 27 pp. 3059-3061, Aug. 1988.

Design Technique, "Adjustable Test Fixture," 1988.

Tong, Peter R., et al., "Noise Measurements at MM-Wave Frequencies," 176 Microwave Journal 31, Jul. 1988.

Barsotti, C., et al., "New Probe Cards Replace Needle Types," Semiconductor International, Aug. 1988, pp. 98-101.

Microwave Journal, "Microwave Products," Sep. 1988, pp. 297.

Cascade Microtech Microprobe Update, "Spurious propagation, modes removed by probe absorber," Apr. 1989.

Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.

Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.

Dalman, G.C., "New Waveguide-to-Coplaner Waveguide Transition for Centimetre and Millimetre Wave Applications," Electronics Letters, Jun. 21, 1990, vol. 26, No. 13.

Cascade Microtech WPH-700 series, "Multicontact High-Speed Integrated Circuit," 1991, 700S-591.

Liu, S.M. Joseph, et al., "A New Probe for W-band On-wafer Measurements," IEEE MTT-S Digest, 1993, pp. 1335-1338.

Photo of Micromanipulator Probe Station, 1994.

Maury Microwave Corp., Transistor Test Fixture (TTF) MT950 Series, May 31, 1995, Advanced Data, 4T/0011.

Cascade Microtech, "Layout rules for WPH-900 Series probes," Applications Note, 1996.

Cascade Microtech, "Air coplanar Probe Series," 1997.

Yong-Dae, Kim , et al. "Fabrication of silicon Micro-Probe for Vertical Probe Card Application," Jpn. J. Appl. Phys. vol. 37, Part 1, No. 12B, Dec. 1998, pp. 7070-7073.

"A Broadband Microwave choke," Microwave Journal, Dec. 1999.

"The Air Coplanar Probe offers a highly compliant, rugged probe with lowest insertion loss available," Cascade Microtech, Inc., Air coplanar Probe Series, 2000.

Cascade Microtech, "On-Wafer Test Solutions for State-of-the-Art Electro-Optical Components," 2001.

Purroy. F. et al., "New Theoretica Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/pID/136.

Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.

Basu, S., et al, "A Membrane Quandrant Probe for R&D Applications," Cascade Microtech, Inc. At Least one year prior to filing.

Electrical Operation, Calibration and Measurement Steps with the HP 8510, At least one year prior to filing.

Whinnery, J.R. et al., "Equivalent Circuits for Discontinuities in Transmission Lines," Proceedings of IRE, at least one year prior to filing.

Inter-Continental Microwave, Application Note: 101, Microwave Semiconductor Chip Measurements using the HP 8510B TRL-Calibration Technique, at least one year prior to filing.

Cascade Microtech, "Special Purpose Probe 40/80 Gb/s High Performance Quandrant," at least one year prior to filing.

Agilent Technology Product Information, HPW281D Waveguide Adapter, 1 mm (m) to W- Band, 75 GHz to 110 GHz.

Cascade Microwave, "Introducing the World's First Microwave Wafer Probing Equipment," 4 pages, 1983.

Malm, R.L. "Reduction of Stray Fields About SEM Samples," IBM Technical Disclosure Bulletin, vol. 21, No. 7, Dec. 1978 2 pages.

Kuhn, Nick, "Accurate and Automatic Noise Figure Measurements with Standard Equipment," Hewlett-Packard co., Inc., Stanford Park Division 1501 Page Mill Road, Palo Alto, CA 94304,3 pages Conference: Technology Grow for the 80's. 1980 IEEE MTT-S International Microwave Symposium Digest, Washington, DC, May 28-30, 1980.

International Search Report for PCT/US06/16238 mailed Feb. 28, 2007.

Written Opinion of the International Searching Authority for PCT/US06/16238, mailed Feb. 28, 2007.

Partial International Search Report for PCT/US2005/039561, mailed Mar. 21, 2006.

International Search Report for PCT/US2005/039561, mailed May 18, 2006.

Written Opinion of the International Searching Authority for PCT/US2005/039561, mailed May 18, 2006.

Bob Stengel. "Neutralized Differential Amplifiers using Mixed-Mode s-parameters," 2003 IEEE Radio Frequency Integrated Circuits Symposium, pp. 711-714.

* cited by examiner

WIDEBAND ACTIVE-PASSIVE DIFFERENTIAL SIGNAL PROBE

CROSS-REFERENCE TO RELATED APPLICATIONS

This application claims the benefit of U.S. Provisional App. No. 60/690,109, filed Jun. 13, 2005 and U.S. Provisional App. No. 60/739,397, filed Nov. 23, 2005.

BACKGROUND OF THE INVENTION

The present invention relates to systems for measuring the characteristics of integrated circuits and other electronic devices and, more particularly, to systems for measuring differential signals used in conjunction with such devices.

Voltage measurements are commonly made by measuring the difference in potential between a conductor and a circuit's ground, which is often assumed to be at zero potential. While voltage is the difference between the electrical potentials at two nodes of a circuit and its measurement is, strictly speaking, the measurement of a differential signal, signaling that utilizes "ground" as the reference is referred to as "single ended" because the amplitude of the signal is represented by the difference between the ground potential and the potential in a single conductor.

On the other hand, a "differential" signal is transmitted on two conductors and the signal's amplitude is the difference between the electrical potentials in the two conductors or at two test points, neither of which is at ground potential. The potentials in the individual conductors, the signal and, ideally, its complement, commonly designated as + and –, vary around an average potential or signal, referred to as the common mode signal which may or may not remain constant. Differential signaling permits discrimination between smaller signal amplitudes because the recovery of the signal's value is largely independent of the value of the circuit's ground potential which may not be consistent within a system. In addition, differential signaling is relatively immune to outside electromagnetic interference and crosstalk from nearby signal conductors because the interference will likely produce an equal effect in each of the conductors of the differential signal. Any equal change in the potentials of the two conductors does not affect the difference between the potentials of the conductors and, therefore, the value of the differential signal. Differential signals also tend to produce less electromagnetic interference than single ended signals because changes in the signal level in the two conductors create opposing electromagnetic fields that tend to cancel each other out reducing crosstalk and spurious emissions. As a result of the inherent advantages in signal integrity, differential signaling has been adopted for electronic signaling at frequencies ranging up to microwave frequencies.

A probe provides the physical and electrical connections between a signal source or test points on a device-under-test (DUT) and an instrument for measuring the signal. For a probe to convey a signal between a device-under-test and an instrument while maintaining signal fidelity, the probe must have sufficient bandwidth, the continuous band of frequencies that the probe can pass without unacceptable diminishment of the signal's power, to pass the signal's major frequency components with minimum distortion. With the exception of DC signals having a frequency of 0 hertz (Hz) and pure sinusoidal signals having a single frequency, signals contain multiple frequencies having values that depend on the shape of the signal's waveform. In the case of square waves and other periodic signals, the bandwidth of the probe should be three to five times higher than the fundamental frequency of the signal to pass the fundamental frequency and, at least, its first few harmonics without undue distortion of their amplitudes. However, probes used for measuring differential signals are typified by bandwidth limitations and multiple probes are typically required to measure differential signals over the broad range of possible frequencies of such signals.

Probes for measuring differential signals comprise both active and passive types. An active probe typically includes a high performance differential amplifier as part of the probe's signal conditioning network. A differential amplifier amplifies the differential mode signal, the difference between the signal and the complementary signal which are the amplifier's inputs, and rejects the common mode signal, any signal that is common to both the signal and the complement. The output of the amplifier is referenced to ground to produce a single ended signal that is generally required by instrumentation used to measure differential signals. The bandwidth of active probes extends from DC up to approximately 15 GHz, the upper limit of operating frequency for high performance instrumentation amplifiers.

Passive AC probes are required when probing differential signals having higher frequencies than those transmissible with an active probe. An AC probe typically employs a common mode choke balun that introduces series inductance to the common mode signal path to attenuate the common mode signal and isolate the differential mode signal. However, the impedance of the common mode choke is frequency dependent and as the frequency of the differential signal decreases the common mode choke becomes less and less effective, producing no effect at DC. Common mode chokes with adequate bandwidth are difficult to build with impedances greater than 50 ohms and must be physically large for frequencies less than approximately 100 kilohertz (KHz). In contrast to the upper frequency limitation for active probes, passive AC probes have a lower frequency limit of approximately 10 KHz.

Differential signaling probes are typically expensive and, as a result of bandwidth limitations inherent in the types of probes used for measuring differential signals, multiple probes are required for testing devices utilizing differential signaling which may comprise signals having a broad range of possible frequencies. What is desired, therefore, is a probe having a bandwidth suitable for measuring differential signals comprising frequency components ranging from DC to microwave frequencies in excess of 100 gigahertz (GHz).

DETAILED DESCRIPTION OF PREFERRED EMBODIMENTS

Figure 1:
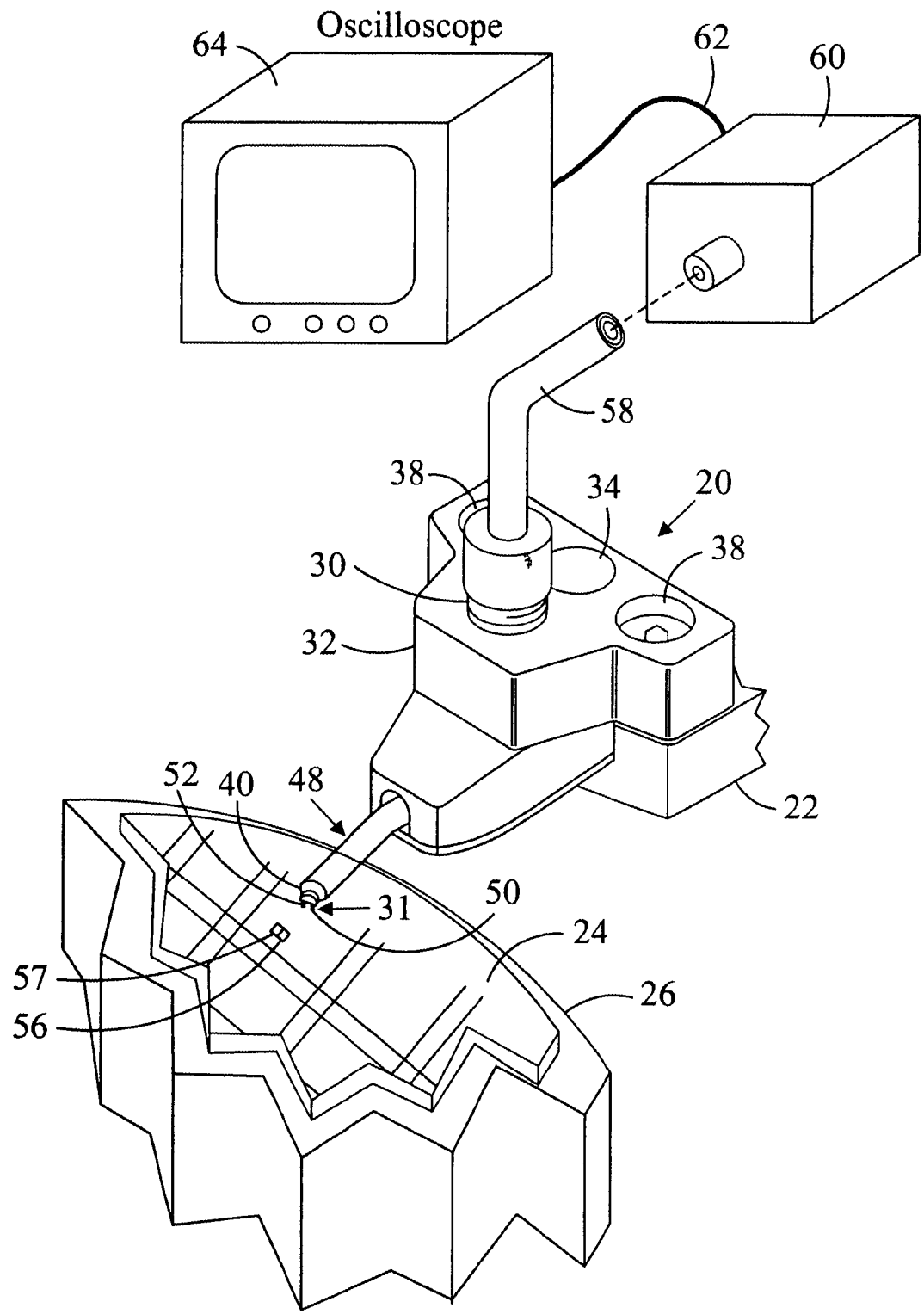
FIG. 1 is a partial perspective view of a probe station including a wideband differential signal probe and a portion of a wafer to be tested.

Differential signaling is used in conjunction with a wide variety of electronic devices because it can provide higher bandwidth, requires less power, and is more resistant to interference than single ended signaling. When measuring a differential signal, a probe provides the physical and electrical connections between the signal source or test points on a device-under-test (DUT) and a measuring instrument. Testing devices and circuits that utilize differential signaling is costly because the frequencies encountered when measuring differential signaling range up to many gigahertz (GHz) and the relatively expensive active and passive probes that are used for measuring differential signals have limited bandwidth.

For a probe to convey a signal between a device-under-test and an instrument while maintaining signal fidelity, the probe must have sufficient bandwidth, the continuous band of frequencies that the probe can pass without unacceptable diminishment of the signal's power, to pass the signal's major frequency components with minimal distortion. With the exception of DC signals having a frequency of 0 hertz (Hz) and pure sinusoidal signals having a single frequency, signals contain multiple frequencies having values that depend on the shape of the signal's waveform. In the case of square waves and other periodic signals, the bandwidth of the probe should be three to five times higher than the fundamental frequency of the signal to pass the fundamental frequency and, at least, its first few harmonics without undue distortion of their amplitudes. Multiple probes are typically required to measure differential signals because the frequencies of the signal components can vary over a wide range and the bandwidth of probes used to measure the signals is more limited than the range of possible signal frequencies.

Active probes comprising high performance differential amplifiers are commonly used for probing differential signals at frequencies less than 15 GHz. The complementary differential signals are applied to the amplifier's inputs and the amplifier amplifies the differential mode signal, the difference between the signal and its complement, and rejects the common mode signal, the portion of the signal that is common to both inputs. The output of the amplifier is referenced to ground to produce a single ended signal that is generally required by the measuring instrumentation. The bandwidth of an active probe is limited by the upper limit of the operating frequency of the differential amplifier. Even expensive, high performance instrumentation amplifiers have an upper frequency limit that is substantially less than the higher frequencies encountered when probing differential signals.

A passive AC probe is typically required for probing differential signaling with signal frequencies in excess of the upper frequency limit of active probes. An AC probe commonly employs a common mode choke balun that introduces series inductance to the common mode signal path to attenuate the common mode signal and isolate the differential mode signal. However, the impedance of a choke is frequency dependent and the common mode chokes of passive AC probes become progressively larger and less effective as the frequency decreases. At DC the common mode choke produces no effect. Passive AC probes generally have a lower frequency limit of approximately 10 KHz. After considering the bandwidth limitations of active and passive probes, the present inventor concluded that a differential signal comprising frequency components that are outside of the frequency range of either a passive or an active probe could be measured by separating the differential mode signal into higher and lower frequency components, converting the higher and lower frequency components of the differential mode signal into single ended, higher and lower frequency signal components and combining the single ended, higher and lower frequency components.

Figure 2:
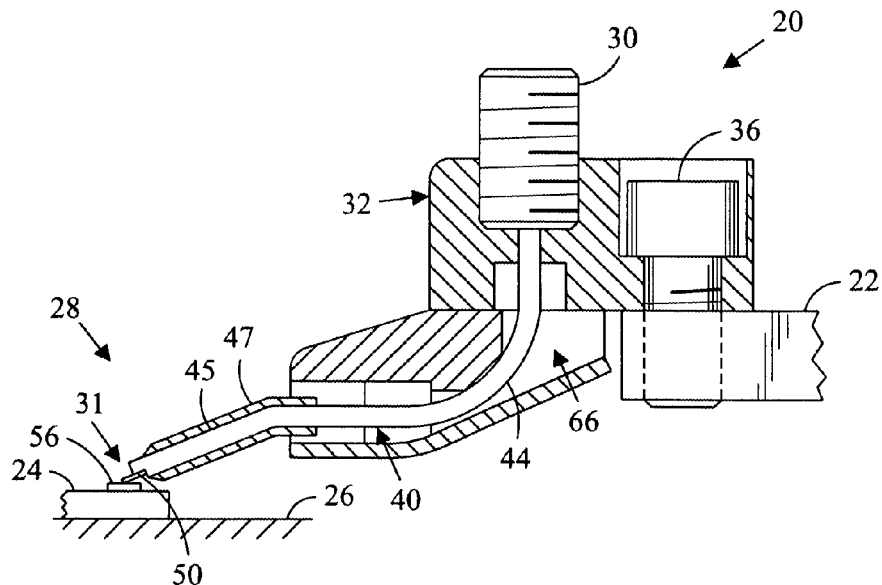
FIG. 2 is a longitudinal sectional view of the wideband differential signal probe of FIG. 1.

Referring in detail to the drawings where similar parts are identified by like reference numerals and, more particularly to FIGS. 1 and 2, a wideband differential signal probe 20 is designed to be mounted on a probe-supporting member 22 of a probe station so as to be movable to a suitable position for probing a device-under-test (DUT), such as an individual component on a wafer 24. In this type of application, the wafer is typically restrained on the upper surface of a chuck 26 which is part of the same probe station. The upper surface of the chuck commonly includes a plurality of apertures that are selectively connectible to a source of vacuum. When the vacuum source is connected to the apertures air pressure, acting on a wafer resting on the upper surface of the chuck, secures the wafer to the chuck's surface. Ordinarily an X-Y-Z positioning mechanism, such as a micrometer knob assembly, is provided to effect movement between the supporting member 22 and the chuck 26 so that the conductive contact tips 50, 52 of the probe can be brought into pressing engagement with appropriate contact or probing pads 56, 57 on the wafer.

To effect connection to the probe-supporting member 22, a round opening 34, formed in a primary support block 32 of the probe, which, in the preferred embodiment shown, is made of brass, is snugly and slidably fitted onto an alignment pin (not shown) that projects upward from the probe-supporting member. A screw 36 is inserted into each of a pair of countersunk openings 38 provided in the primary support block. The screws engage corresponding threaded apertures in the probe-supporting member to secure the probe to the supporting member.

The exemplary wideband probe 20 has a signal transmission port which, in the preferred embodiment depicted, comprises a K-connector 30. This connector enables an ordinary coaxial cable 58 to be connected to the probe providing a shielded high frequency transmission channel between the probe and the external signal conditioning circuitry or instrumentation. In the embodiment depicted, the coaxial cable is connected to an external signal conditioning module 60 that includes signal conditioning circuitry and a similar coaxial cable 62 connects the signal conditioning module to a measuring instrument 64, such as an oscilloscope. On the other hand, the signal conditioning circuit might be incorporated into the body of the probe and probe's port could be connected directly to the instrument. If desired and suitable, other types of conductors and connectors can be used for conducting signals, such as a 2.4 mm connector, a 1.85 mm connector or a 1 mm connector. On the other hand, a waveguide may be used to connect the probe to the signal conditioning module or the instrumentation.

A semi-rigid coaxial cable 40 is retained in the primary support block 32 and is connected, within the block, to the K-connector 30. Before being connected to the K-connector, the cable 40 is bent along first and second intermediate portions 44 and 45 in the manner illustrated in FIG. 2 so that an upwardly curving 90° bend and a downwardly curving 230 bend are formed in the cable. The rearward end of the cable 40 is attached to the K-connector while the forward end 48 of the cable 40 is passed through a passage 66 in the primary support block and remains freely suspended and, in this condition, serves as a movable support for the probing end 31 of the probe. At the probing end 31 of the exemplary wideband probe 20, a first conductive finger 50 is conductively connected to the inner conductor of the cable and, at least one, second conductive finger 52 is conductively connected to the outer conductor so as to provide respective paths for the conduction of a signal and a complementary signal, making up a differential signal, from respective probing pads 56, 57 on the DUT to the signal conditioning module 60. Additional shielding 47, such as microwave absorbing material, may be applied to the forward end 48 of the cable.

Figure 3:
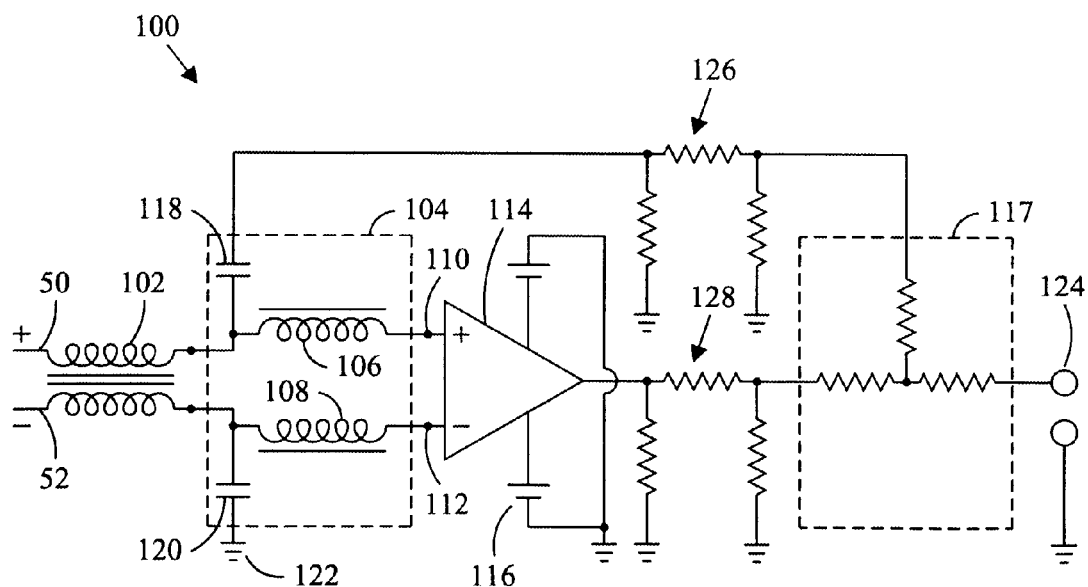
FIG. 3 is a schematic diagram of a signal conditioning network of a wideband differential signal probe.

Referring to FIG. 3, the wideband differential probe 20 includes a first embodiment of a signal conditioning network 100 which may be included in the measuring instrument, a separate signal conditioning module 60 or mounted on the body of the probe. A differential signal comprises a differential mode signal, the difference between the amplitude of the signal and the amplitude of the complementary signal, and a common mode signal, the portion of the differential signal's value that is common to both the signal and its complement. The conductive contact tips 50, 52 conducting, respectively, the signal and the complement are connected to respective inputs of a common mode choke 102. The common mode signal is attenuated by the common mode choke because the core of the common mode choke is energized by the common mode signal but not by the differential mode signal and because the input impedance of the choke is high for the common mode signal and substantially less for the differential mode signal. However, the impedance of a choke is frequency dependent and as the signal frequency is reduced the common mode choke has progressively less effect on the common mode signal, producing no effect at DC. Higher frequency common mode signals are attenuated by the common mode choke, separating the differential mode signal and the lower frequency common mode signal from the differential input signal.

A diplexer 104 comprising a high pass filter in parallel with a low pass filter separates the output of the common mode choke 102 into higher frequency and lower frequency components. The low pass filter of the diplexer 104 comprises parallel inductors 106,108 connecting respective outputs of the common mode choke and the inverting 110 and non-inverting 112 inputs of a differential amplifier 114. The inductors 106, 108 block higher frequency components of the output of the common mode choke and conduct lower frequency components to the respective inputs of the amplifier 114. For a smooth transition between the active and passive signal paths, the differential amplifier should have both a well defined termination impedance and the ability to drive a 50 ohm load through the passive summing network of a resistive combiner. The differential amplifier 114 rejects the common mode component of the input to separate the lower frequency differential mode signals from the signals at its inputs. The amplitude of the differential mode signal controls the output of the differential amplifier but the load, powered by the output, receives its current from the DC power source 116 for the amplifier. As a result, the amplifier outputs a single ended, lower frequency signal component to a resistive combiner 117 that is conductively connected to the amplifier's output.

The parallel high pass filter of the diplexer 104 comprises capacitors 118, 120 connected to the outputs of the common mode choke 102. The high pass filter provides a signal path from the non-inverting input 110 of the differential amplifier to the resistive combiner 117 for the higher frequency components of the output of the common mode choke. The higher frequency components of the choke's output comprise the higher frequency portions of the differential mode signal. The high frequency signal is referenced to ground 122 through the capacitor 120 connected to the inverting input 112 of the amplifier 114 to convert the differential mode signal to a single ended signal that is summed with the single ended, lower frequency output of the differential amplifier to produce an output signal at terminals 124 for transmission to the measuring instrumentation.

Attenuators 126, 128 in the conductive connection from the non-inverting input of the amplifier to the resistive combiner and at the output of the differential amplifier reduce the loop gain in the high frequency signal path to less than unity to prevent feedback around the differential amplifier and signal oscillation.

Figure 4:
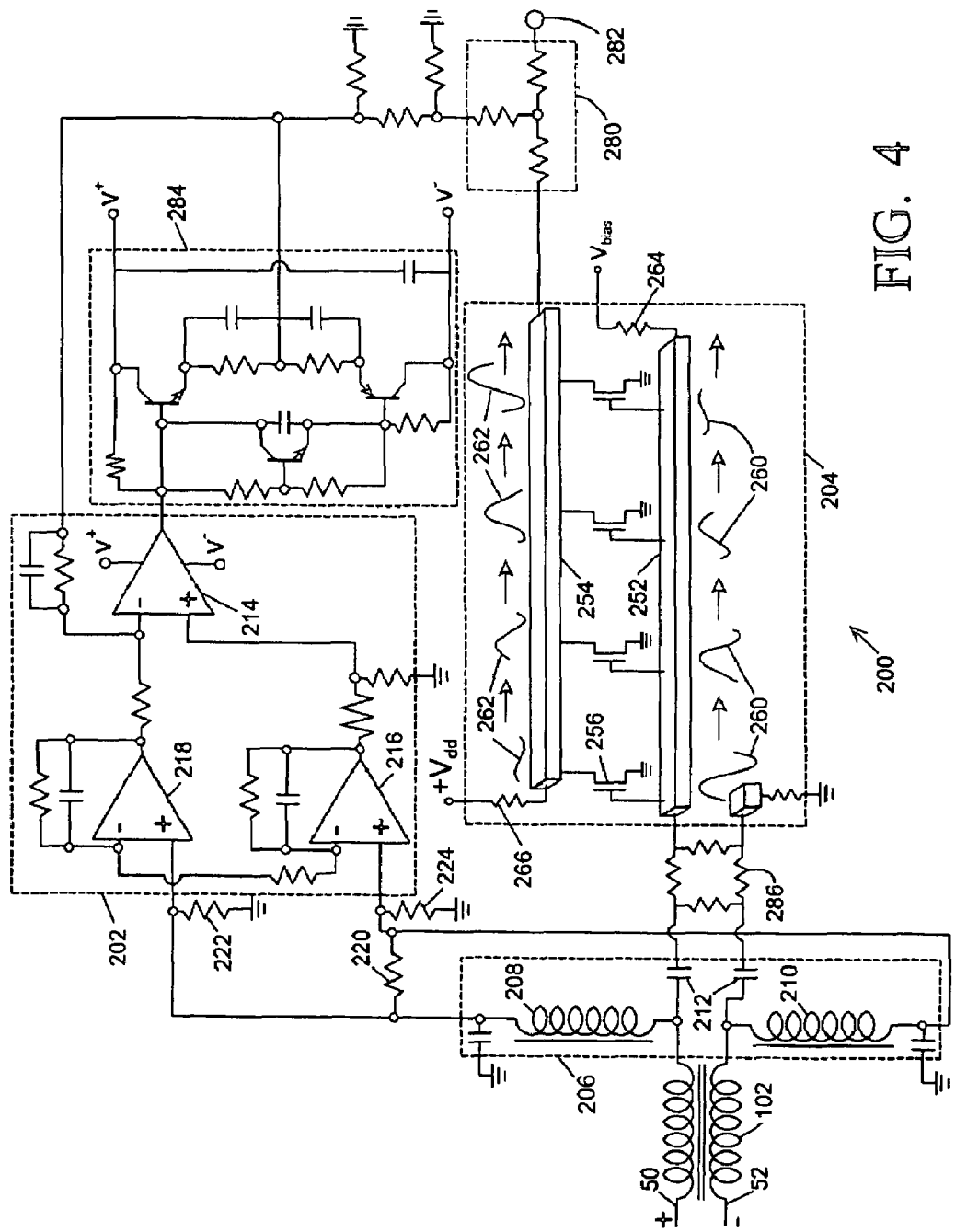
FIG. 4 is a schematic diagram of another embodiment of a signal conditioning network of a wideband differential signal probe.

Referring to FIG. 4, another embodiment of a signal conditioning network 200 for a wideband differential signal probe provides a low frequency signal path that includes an instrumentation amplifier 202 and a high frequency signal path that includes a single ended, distributed amplifier 204.

The higher frequency, common mode signal component of the differential input signal at the contact tips 50, 52 is attenuated by a common mode choke 102. The output of the common mode choke comprises a lower frequency common mode component of the input signal and the differential mode component of the input signal. A differential diplexer 206 separates the signal output of the common mode choke 102 into higher and lower frequency components. Parallel inductors 208, 210 of the diplexer block the higher frequency components of the common mode choke output and permit the lower frequency components of the signal to be conducted to the inputs of the instrumentation amplifier 202. The parallel capacitors 212 of the diplexer block lower frequency components of the common mode choke output but allow the higher frequency components of the signal to be transmitted to the distributed amplifier 204.

The low frequency signal path comprises, generally, the instrumentation amplifier 202 including a differential amplifier 214 and input buffer amplifiers 216, 218 and an output amplifier 284. The low frequency output of the diplexer is applied to the non-inverting inputs of the buffering amplifiers which provide a high input impedance for the instrumentation amplifier. The input impedance for the differential mode signal component can be adjusted by varying the input termination resistance 220 conductively connecting the inputs of the instrumentation amplifier. The input impedance for the common mode signal can be selected by varying the resistance the termination resistors 222, 224 connecting the respective inputs of the instrumentation amplifier to ground. The differential amplifier 214 rejects the common mode component of the instrumentation amplifier input to isolate the lower frequency differential mode portion of the probe's input signal. To increase the power and enable relatively large voltage swings in the output of the low frequency signal path, the output of the differential amplifier 214 is interconnected to an output amplifier 284.

The parallel capacitors 212 of the diplexer 206 block transmission of the low frequency portion of the output of the common mode choke but permit the high frequency differential mode component of the signal to be conducted to a wideband distributed amplifier 204. The distributed amplifier comprises parallel, input 252 and output 254 transmissions lines; preferably, 50 ohm microstrips. The input and output transmission lines are tapped at a plurality of points along their length by signal paths that connect the transmission lines. The signal paths comprise transistors 256 typically having a gate connected to the input transmission line and a drain connected to the output transmission line. The traveling wave 260 on the input transmission line is amplified at each signal path by its respective transistor. The incident wave 262 on the output transmission line travels in synchronization with the traveling wave on the input line. To avoid reflections, the traveling waves on the input and output lines are absorbed by terminations, through resistors 264, 266, respectively, matched to the loaded characteristic impedance of the input transmission line and the output transmission line. Each transistor adds power, in phase with the signal, at each tap point along the output line. The distributed amplifier is capable of a higher gain-bandwidth product than a lumped amplifier because each signal path contributes some gain to the output.

The input impedance of the distributed amplifier to high frequency differential signal can be adjusted by selecting the resistances of the resistors incorporated in a high frequency differential input attenuator 286. Independent adjustment of the high and low frequency termination impedance and the differential input attenuator enable balancing of the performance of the high and low frequency signal paths to optimize performance of the signal conditioning network at the crossover between the signaling paths.

The outputs of the high frequency signal path and the low frequency signal path are combined in a resistive combiner 280 to provide the wideband probe's output 282 to a measuring instrument.

The wideband probe enables probing of differential signals comprising frequencies ranging from DC to microwave frequencies with a single probe. In addition, since the active and passive elements of the hybrid active-passive wideband probe are complementary, neither the common mode choke nor the differential amplifier must be designed to operate at the extremes of the operating frequency for the respective type of device. Therefore, smaller and lower cost chokes and lower cost differential amplifiers can be used in the hybrid probe while increasing bandwidth of the probe. Incorporating amplifiers in both the high and the low frequency signal paths enables the gain from the input to the output of the signal conditioning network to be unity or greater, reduces feedback around the low-frequency amplifier and enables the sensitivity to be set before the signal is amplified and amplifier noise is acquired.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

I claim:

1. A probe for communicating a differential signal of a device under test, said differential signal comprising at least one of a higher frequency component, including at least one of a higher frequency common mode signal and a higher frequency differential mode signal, and a lower frequency component, including at least one of a lower frequency common mode signal and a lower frequency differential mode signal, said probe comprising:
   (a) a choke attenuating said higher frequency common mode signal of said differential signal and having a choke output comprising at least one of said higher frequency differential mode signal and said lower frequency component of said differential signal;
   (b) a first filter blocking said higher frequency differential mode signal of said choke output and transmitting said lower frequency component of said choke output;
   (c) a differential amplifier attenuating said lower frequency common mode signal of said lower frequency component transmitted by said first filter and converting said lower frequency differential mode signal to a single ended, lower frequency signal;
   (d) a second filter blocking transmission of said lower frequency component of said common mode choke output and transmitting a higher frequency single ended signal corresponding to said higher frequency differential mode signal; and
   (e) a combiner summing said single ended, lower frequency signal and said single ended, higher frequency signal.

2. The probe of claim 1 wherein a loop gain of said differential amplifier is less than unity.

3. A probe for communicating a differential signal of a device under test, said differential signal comprising at least one of a higher frequency component, including at least one of a higher frequency common mode signal and a higher frequency differential mode signal, and a lower frequency component, including at least one of a lower frequency common mode signal and a lower frequency differential mode signal between a device under test and an instrument, said probe comprising:
   (a) a choke attenuating said higher frequency common mode signal of said differential signal and having a choke output comprising at least one of said higher frequency differential mode signal and said lower frequency component of said differential signal;
   (b) a first filter blocking said higher frequency differential mode signal of said choke output and transmitting said lower frequency component of said choke output;
   (c) a differential amplifier attenuating said lower frequency common mode signal of said lower frequency component transmitted by said first filter and converting said lower frequency differential mode signal to a single ended, lower frequency signal;
   (d) a second filter blocking transmission of said lower frequency component of said common mode choke output and transmitting a higher frequency single ended signal corresponding to said higher frequency differential mode signal; and
   (e) a resistive combiner to combine said single ended, lower frequency signal and said single ended, higher frequency signal;
   (f) a first attenuator conductively connected to said combiner and to an input of said differential amplifier; and
   (g) a second attenuator conductively connected to said combiner and to an output of said differential amplifier.

4. A probe for communicating a differential signal of a device under test, said differential signal comprising at least one of a higher frequency component, including at least one of a higher frequency common mode signal and a higher frequency differential mode signal, and a lower frequency component, including at least one of a lower frequency common mode signal and a lower frequency differential mode signal, said probe comprising:
   (a) a choke attenuating said higher frequency common mode signal of said differential signal and having a choke output comprising at least one of said higher frequency differential mode signal and said lower frequency component of said differential signal;
   (b) a first filter blocking said higher frequency differential mode signal of said choke output and transmitting said lower frequency component of said choke output;
   (c) a differential amplifier attenuating said lower frequency common mode signal of said lower frequency component transmitted by said first filter and converting said lower frequency differential mode signal to a single ended, lower frequency signal;

(d) a second filter blocking transmission of said lower frequency component of said common mode choke output and transmitting said higher frequency differential mode signal;

(e) a distributed amplifier receiving said higher frequency differential mode signal and outputting a single ended higher frequency signal; and (f) a resistive combiner to combine said single ended, lower frequency signal and said single ended, higher frequency signal.

5. A probe for communicating a differential signal of a device under test, said differential signal comprising at least one of a higher frequency component, including at least one of a higher frequency common mode signal and a higher frequency differential mode signal, and a lower frequency component, including at least one of a lower frequency common mode signal and a lower frequency differential mode signal, said probe comprising:

(a) a choke attenuating said higher frequency common mode signal of said differential signal and having a choke output comprising at least one of said higher frequency differential mode signal and said lower frequency component of said differential signal;

(b) a first filter blocking said higher frequency differential mode signal of said choke output and transmitting said lower frequency component of said choke output;

(c) a differential amplifier attenuating said lower frequency common mode signal of said lower frequency component transmitted by said first filter and converting said lower frequency differential mode signal to a single ended, lower frequency signal, said differential amplifier having;

(i) a variable lower frequency common mode signal input impedance; and (ii) a variable lower frequency differential mode signal input impedance;

(d) a second filter blocking transmission of said lower frequency component of said common mode choke output and transmitting said higher frequency differential mode signal;

(e) an attenuator of said higher frequency differential mode signal transmitted from said second filter;

(f) a distributed amplifier receiving said attenuated higher frequency differential mode signal and outputting a single ended higher frequency signal; and (g) a combiner summing said single ended, lower frequency signal and said single ended, higher frequency signal.

* * * * *